US012216152B2

(12) United States Patent
Lai et al.

(10) Patent No.: US 12,216,152 B2
(45) Date of Patent: Feb. 4, 2025

(54) GALLIUM NITRIDE-BASED DEVICES AND METHODS OF TESTING THEREOF

(71) Applicant: Taiwan Semiconductor Manufacturing Company, Ltd., Hsinchu (TW)

(72) Inventors: Yi-An Lai, Taipei (TW); Chan-Hong Chern, Palo Alto, CA (US); Cheng-Hsiang Hsieh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/516,106

(22) Filed: Nov. 21, 2023

(65) Prior Publication Data

US 2024/0085472 A1   Mar. 14, 2024

Related U.S. Application Data

(63) Continuation of application No. 17/737,717, filed on May 5, 2022, now Pat. No. 11,852,675.

(Continued)

(51) Int. Cl.
*G01R 31/28* (2006.01)
*H01L 21/02* (2006.01)

(52) U.S. Cl.
CPC ...... *G01R 31/2853* (2013.01); *H01L 21/0254* (2013.01)

(58) Field of Classification Search
CPC ............ G01R 31/2853; G01R 31/2884; G01R 31/2879; G01R 1/0416; G01R 31/2863; H01L 21/0254; H01L 27/0248

(Continued)

(56) References Cited

U.S. PATENT DOCUMENTS

2007/0159203 A1* 7/2007 Banno .............. G01R 31/31713
324/762.05
2017/0025318 A1* 1/2017 Ishii ....................... H01L 24/49
(Continued)

FOREIGN PATENT DOCUMENTS

JP   2000-307068 A   11/2000
JP   2007-188931 A    7/2007
(Continued)

OTHER PUBLICATIONS

Office Action issued in connection with Japanese Appl. No. 2022-205294 dated Jan. 4, 2024.
(Continued)

*Primary Examiner* — Giovanni Astacio-Oquendo
(74) *Attorney, Agent, or Firm* — FOLEY & LARDNER LLP

(57) ABSTRACT

An integrated circuit includes a first circuit, formed based on one or more Group III-V compound materials, that is configured to operate with a first voltage range. The integrated circuit includes a second circuit, also formed based on the one or more Group III-V compound materials, that is operatively coupled to the first circuit and configured to operate with a second voltage range, wherein the second voltage range is substantially higher than the first voltage range. The integrated circuit includes a set of first test terminals connected to the first circuit. The integrated circuit includes a set of second test terminals connected to the second circuit. Test signals applied to the set of first test terminals and to the set of second test terminals, respectively, are independent from each other.

20 Claims, 19 Drawing Sheets

Related U.S. Application Data

(60) Provisional application No. 63/294,505, filed on Dec. 29, 2021.

(58) Field of Classification Search
USPC .................................. 324/750.01, 537, 500
See application file for complete search history.

(56) References Cited

U.S. PATENT DOCUMENTS

| | | |
|---|---|---|
| 2017/0356953 A1 | 12/2017 | Wang et al. |
| 2019/0172829 A1 | 6/2019 | Lee et al. |
| 2020/0233028 A1 | 7/2020 | Forrest et al. |
| 2021/0181251 A1 | 6/2021 | Hsieh |
| 2021/0247478 A1 | 8/2021 | Scheller et al. |
| 2022/0413038 A1 | 12/2022 | Kim |
| 2023/0029337 A1 | 1/2023 | Liu |
| 2023/0369147 A1* | 11/2023 | Lai ..................... H01L 29/402 |

FOREIGN PATENT DOCUMENTS

| | | |
|---|---|---|
| JP | 2015-021798 A | 2/2015 |
| JP | 2017-026505 A | 2/2017 |
| TW | 201913126 A | 4/2019 |
| TW | 202044530 A | 12/2020 |
| TW | 202045942 A | 12/2020 |
| TW | 202113382 A | 4/2021 |
| TW | 202146919 A | 12/2021 |

OTHER PUBLICATIONS

Notice of Allowance on U.S. Appl. No. 17/737,717 DTD Sep. 1, 2023.

Office Action issued in connection with Taiwan Appl. No. 111150491 dated Oct. 5, 2023.

* cited by examiner

GALLIUM NITRIDE-BASED DEVICES AND METHODS OF TESTING THEREOF

CROSS-REFERENCE TO RELATED APPLICATIONS

This application is a continuation of U.S. patent application Ser. No. 17/737,717, filed May 5, 2022, which claims priority to and the benefit of U.S. Provisional Application No. 63/294,505, filed Dec. 29, 2021, each of which is incorporated herein by reference in its entirety for all purposes.

BACKGROUND

Over the past several decades, silicon-based electronic devices (e.g., Metal-Oxide-Semiconductor Field-Effect-Transistors (MOSFETs)) have been fairly successful and represent the present standard for power applications (e.g., AC/DC supplies, DC/DC supplies, and motor controls) ranging from just tens of watts up to hundreds and even thousands of watts. Such silicon-based electronic devices have seen continual improvements in key parameters such as on-resistance $R_{DS(ON)}$, voltage ratings, switching speed, packaging, and other attributes. However, the rate of improvements in these silicon-based electronic devices has leveled off, as their performance is now close to the theoretical limit as determined by the underlying fundamental physics of these materials and processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
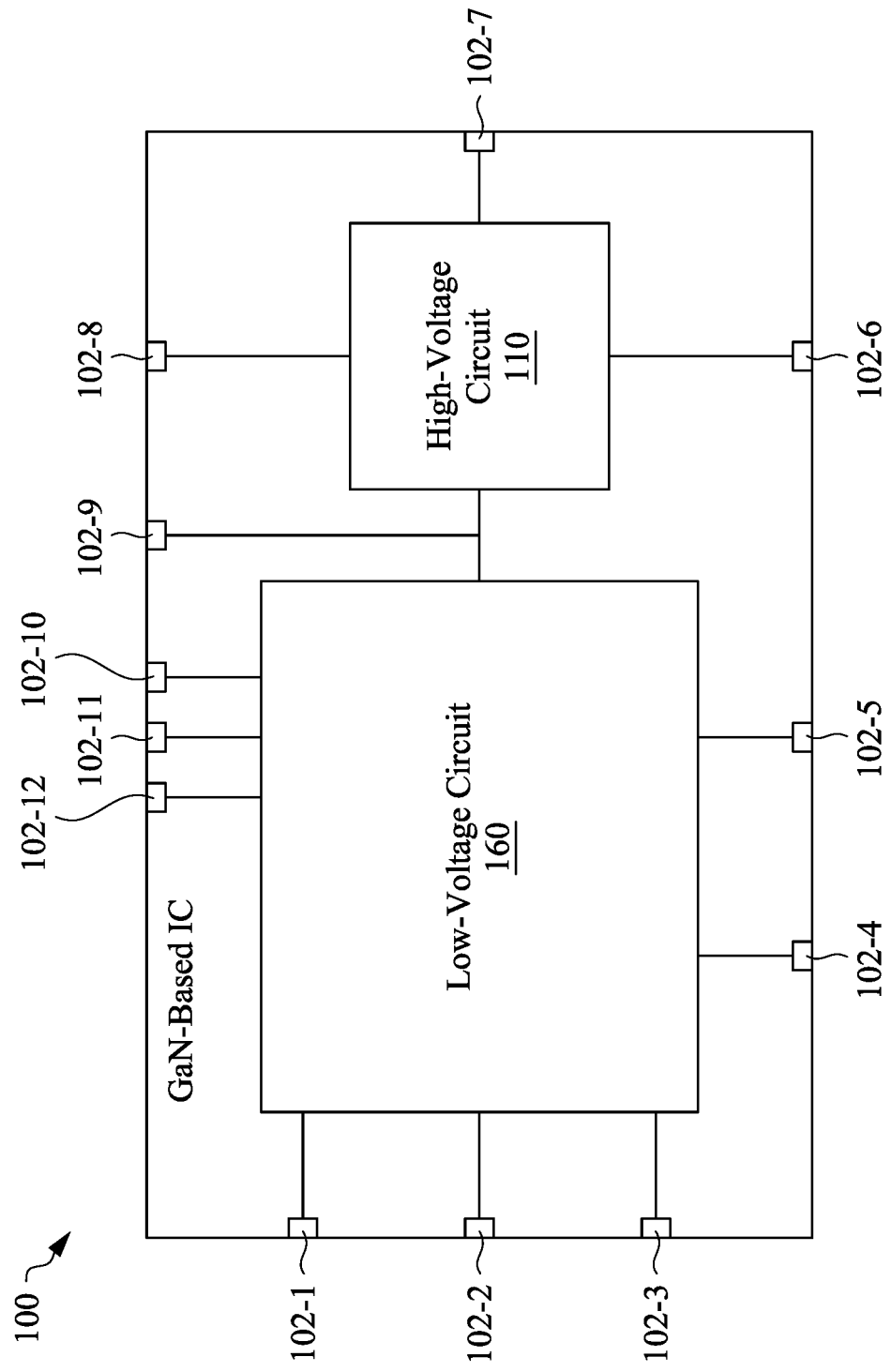
FIG. 1 illustrates a block diagram of a GaN-based integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Group III-Group V (or Group III-V) semiconductor compound materials are generally considered as one of replacement materials for silicon, because of their supreme material characteristics when compared to silicon. For example, gallium nitride (GaN)-based materials have been widely investigated in a variety of electronic and/or optoelectronic applications. The GaN-based material typically refers to gallium nitride (GaN) and its alloys such as aluminum gallium nitride (AlGaN), indium gallium nitride (InGaN), and aluminum indium gallium nitride (AlInGaN). In particular, the GaN-based material is a wide bandgap semiconductor and is able to maintain its electrical performance at higher temperatures as compared to other semiconductors, such as silicon or gallium arsenide. The GaN-based material also has a higher carrier saturation velocity compared to silicon. Additionally, the GaN-based material has a Wurtzite crystal structure, is a hard material, has a high thermal conductivity, and has a much higher melting point than other conventional semiconductors such as silicon, germanium, and gallium arsenide. Accordingly, the GaN-based material is useful for high-voltage and high-power applications.

Conventionally, only high-voltage devices are formed of the GaN-based materials, while low-voltage devices may still be formed of silicon. Such a hybrid integration can sometimes induce adverse effects such as, for example, increasing cost/complexity in fabrication, additional consumption of real estate, relatively large parasitic inductance, etc. With the advance of semiconductor processing technologies, it has been adopted to monolithically integrate both high-voltage devices and low-voltage devices based on the same GaN-based material, sometimes referred to as a GaN-based integrated circuit. For example, a GaN-based integrated circuit can include a number of circuits (e.g., control circuits, drivers, protection circuits, etc.) operating with a relatively high voltage range and a number of circuits (e.g., power transistors) operating with a relatively low voltage range, each of which can include at least one GaN-based material formed as one of its active components (e.g., a transistor channel).

Although GaN-based optoelectronic and electronic devices are of tremendous commercial importance, the quality and reliability of these devices, however, is commonly compromised by relatively high defect levels in one or more semiconductor layers of the devices. Such defects can, for example, arise from: (1) lattice mismatch of GaN-based semiconductor layers to a non-GaN substrate such as silicon, sapphire, or silicon carbide; (2) the coalescence fronts of epitaxially-overgrown layers; (3) thermal expansion mismatch; (4) impurities; and (5) tilt boundaries. The presence of defects has a deleterious effect on epitaxially-grown layers. Such effect includes compromising electronic/optoelectronic device performance.

To overcome these defects, techniques have been proposed that require complex, tedious fabrication processes to reduce the concentration and/or impact of the defects. While a substantial number of conventional growth methods for GaN-based crystals have been proposed, limitations still exist. For example, the conventional techniques can only detect, test, screen, or otherwise identify such defects well before making a completed GaN-based integrated circuit. Even though some techniques have been proposed to identify some of the defects in the high-voltage devices, these techniques cannot identify any defect on the side of low-voltage devices, and can sometimes do additional damage to the low-voltage devices while testing the high-voltage devices. For example, the existing GaN-based integrated circuit typically has respective sources of the low-voltage and high-voltage circuits connected to each other together, which can inherently lead to at least the above-listed adverse effects. That is, no effective and efficient techniques, on a circuit level, have been proposed to detect, test, screen, or otherwise identify those "material-level" defects in a GaN-based integrated circuit.

The present disclosure provides various embodiments of a GaN-based integrated circuit that allows defects in any of its low-voltage circuits and high-voltage circuits to be detected on a circuit level. In various embodiments, the GaN-based integrated circuit, as disclosed herein, includes a respective number of test terminals (pads or pins) connected to each of the low-voltage circuits and high-voltage circuits. Such test terminals, across different high/low-voltage circuits, may be electrically or otherwise operatively isolated from one another, in accordance with various embodiments. In this way, defects or malfunctions present in the high-voltage circuit(s) and low-voltage circuit(s) can be jointly or individually identified. For example, the present disclosure provides various embodiments of methods to utilize these test terminals to jointly identify an epitaxial defect that can be present in both of the high-voltage and low-voltage circuits, to individually identify a surface defect that can be present in the high-voltage circuit, to individually identify a defect that can be present in a junction of gate to source of the high-voltage circuit while substantially suppressing leakage current from the low-voltage circuit, and individually identify a malfunction of each of the low-voltage and high-voltage circuits.

FIG. 1 illustrates a block diagram of a GaN-based integrated circuit 100, in accordance with various embodiments. It should be understood that the block diagram of FIG. 1 is simplified for illustration purposes. Thus, the GaN-based integrated circuit 100 can include any of various other (e.g., functional) blocks, while remaining within the scope of present disclosure.

As will be discussed below, the GaN-based integrated circuit 100 includes a number of (e.g., electronic) components formed based on a GaN-based material such as, for example, gallium nitride (GaN) and its alloys such as aluminum gallium nitride (AlGaN), indium gallium nitride (InGaN), and aluminum indium gallium nitride (AlInGaN). Example of these components include, but are not limited to, transistors, resistors, capacitors, diodes, etc. Such a GaN-based material may be epitaxially grown on a non-GaN-based material that functions as a substrate for the GaN-based integrated circuit 100 such as, for example, silicon, sapphire, and/or silicon carbide. The GaN-based integrated circuit 100 may be implemented as a single system-on-a-chip (SoC) architecture or a multi-SoC architecture. Accordingly, the GaN-based integrated circuit 100 may be formed on a single substrate or on multiple substrates.

As shown, the GaN-based integrated circuit 100 includes at least one high-voltage circuit (or circuitry) 110 and at least one low-voltage circuit (or circuitry) 160. The high-voltage circuit 110 and the low-voltage circuit 160 are operatively coupled to each other, in various embodiments. Each of the high-voltage circuit 110 and low-voltage circuit 160 includes a number of GaN-based components. Accordingly, the high-voltage circuit 110 and low-voltage circuit 160 may sometimes be referred to as being monolithically integrated in the GaN-based integrated circuit 100, which may, for example, serve as an all-GaN power integrated circuit (e.g., an electric power converter).

In various embodiments, the components of the high-voltage circuit 110 can operate under a voltage range substantially higher than a voltage range under which the components of the low-voltage circuit 160 can operate. For example, the components of the high-voltage circuit 110 can sustain operation under a voltage range of over 40 volts (for example, voltages around 600 volts), and the components of the low-voltage circuit 160 can sustain operation under a voltage range of up to 12 volts. However, it should be understood that the respective components of high-voltage circuit 110 and low-voltage circuit 160 can operate with any of various other voltage ranges, while remaining within the scope of present disclosure.

In various embodiments, the GaN-based integrated circuit 100 further includes a number of (test) terminals, 102-1, 102-2, 102-3, 102-4, 102-5, 102-6, 102-7, 102-8, 102-9, 102-10, 102-11, and 102-12. The terminals 102-1 to 102-12 are operatively (e.g., electrically) isolated from one another. Further, the terminals 102-1 to 102-5 and 102-10 to 102-12 may be operatively coupled to the low-voltage circuit 160, and the terminals 102-6, 102-8, and 102-9 may be operatively coupled to the high-voltage circuit 110, with the terminal 102-7 connected to one or more substrates of the GaN-based integrated circuit 100. With the respective sets of terminals coupled to the high-voltage circuit 110 and low-voltage circuit 160, various defects of the high-voltage circuit 110 and/or low-voltage circuit 160 can be efficiently and effectively identified, which will be discussed in further detail below. In various embodiments, each of the terminals 102-1 to 102-12 is electrically coupled to one or more bump structures (e.g., solder balls, copper bumps, copper pillars, or other connector elements), through a number of interconnect structures (e.g., metal lines, metal vias, etc.), and to the electrode of a GaN-based component (e.g., a transistor, a capacitor, a resistor, a diode, etc.) of the GaN-based integrated circuit 100.

Figure 2:
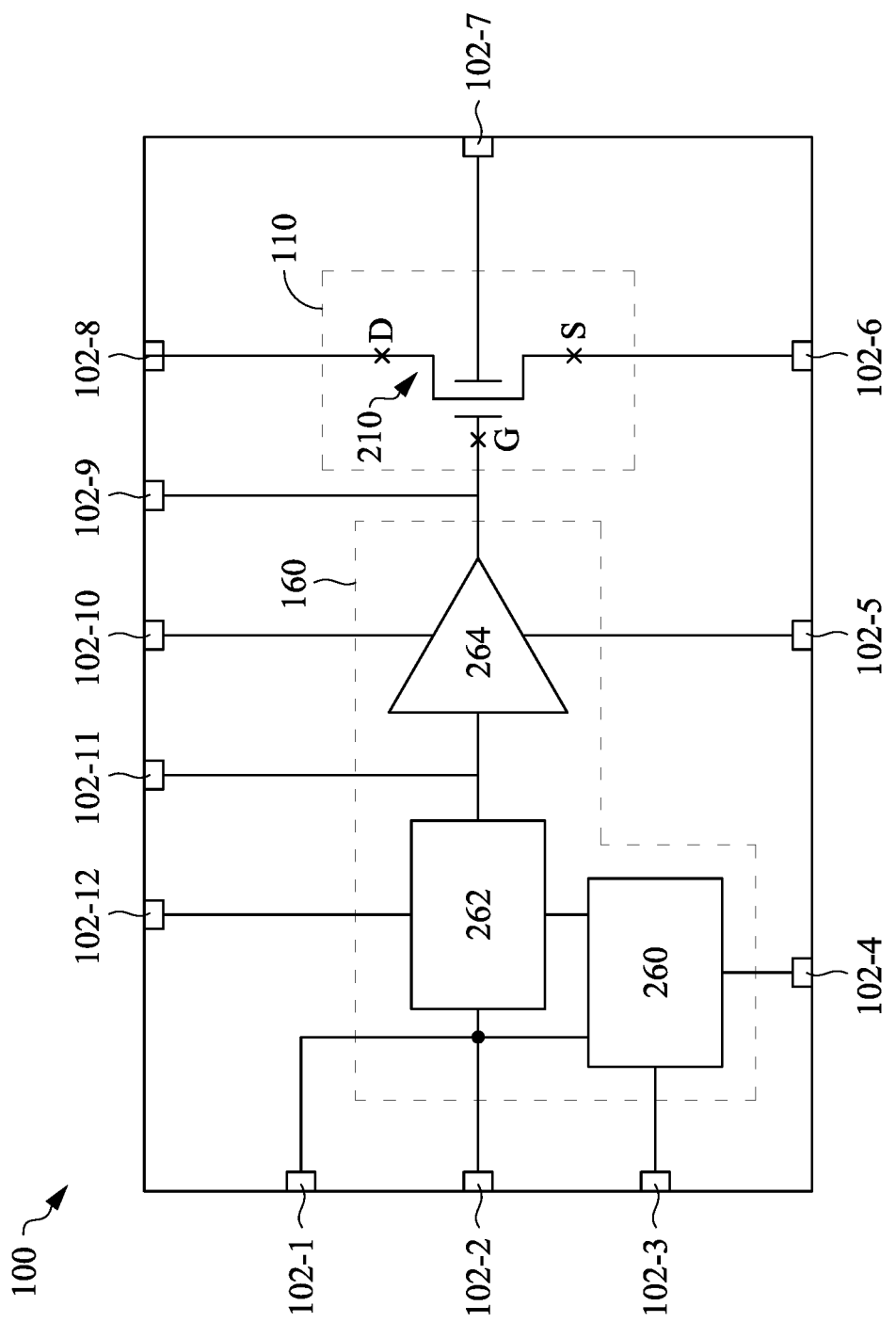
FIG. 2 illustrates a detailed block diagram of the GaN-based integrated circuit of FIG. 1, in accordance with some embodiments.

Referring to FIG. 2, a further detailed block diagram of the GaN-based integrated circuit 100 is illustrated as a representative example, in accordance with various embodiments. It should be understood that the block diagram of FIG. 2 is simplified for illustration purposes. Thus, each of the high-voltage circuit 110 and low-voltage circuit 160 can include any of various other (e.g., functional) blocks or components, while remaining within the scope of present disclosure. As shown, the high-voltage circuit 110 includes a number of power transistors 210 (e.g., coupled to one another in series); and the low-voltage circuit 160 includes an electrostatic discharge (ESD) protection circuit 260, a control circuit 262, and a driver circuit 264.

On the high-voltage side, the power transistor 210 has a gate (G), source (S), and drain (D) connected to the terminals 102-9, 102-6, and 102-8, respectively. On the low-voltage side, the ESD protection circuit can be connected to the terminals 102-1, 102-2, 102-3, and 102-4; the control circuit 262 can be connected to the terminals 102-1, 102-2, and 102-12 (and to the terminal 102-4 through the ESD protection circuit 260); and the driver circuit 264 is connected to the terminals 102-5, 102-10, and 102-11. Each of the terminals 102-1 to 102-12 may be implemented as a pin of the GaN-based integrated circuit 100, in accordance with various embodiments.

In various embodiments, the ESD protection circuit 260 can prevent ESD events from happening (or damaging) to the coupled circuit(s), e.g., the control circuit 262. The terminal 102-2 (which can serve as an input/output (I/O) pin of the GaN-based integrated circuit 100) and terminal 102-4 may serve as a high side and low side of the ESD protection circuit 260, respectively. For example, the terminals 102-2 and 102-4 can each prevent an ESD pulse from being coupled to the control circuit 262. The terminal 102-3 may be connected to one or more internal nodes of the ESD protection circuit 260 as a probing terminal to test whether the ESD protection circuit 260 can properly function. The terminal 102-3 may be optionally formed. The control circuit 262, which can receive one or more input signals through the terminal 102-2 and a supply voltage through the terminal 103-12, can provide one or more control signals to the driver circuit 264. The terminal 102-1 may be connected to one or more internal nodes of the control circuit 262 as a probing terminal to test whether the control circuit 262 can properly function. The terminal 102-11 may be connected to an input of the driver circuit 264, which can provide a functional signal (e.g., a functional voltage) to test the driver circuit 264. The terminals 102-10 and 102-5 can provide different supply voltages to the driver circuit 264, respectively. The terminal 102-9 may be connected to an input of the power transistor(s) 210, which can provide a functional signal (e.g., a functional voltage) to the power transistor(s) 210. The terminals 102-8 and 102-6 can provide different supply voltages to the power transistor(s) 210, respectively. The power transistor(s) 210, which can be implemented as a switching or linear regulator, may charge a load of the GaN-based integrated circuit 100 through an I/O pin (not shown) of the GaN-based integrated circuit 100.

FIGS. 3, 4, 5, 6, 7, and 8 illustrate a variety of example GaN-based components, 300, 400, 500, 600, 700, and 800 respectively, that can be implemented to constitute at least one of the high-voltage circuit 110 and low-voltage circuit 160 of the GaN-based integrated circuit 100, in accordance with various embodiments. The GaN-based components 300 to 800 each include at least one of the GaN-based materials (e.g., GaN, AlGaN, InGaN, AlInGaN, etc.) serving as its active element (e.g., the active channel of a transistor). Further, the GaN-based components 300 to 800 may be formed on the same or different non-GaN-based substrates (e.g., silicon) of the integrated circuit 100. As such, each of the GaN-based components 300 to 800 has one or more GaN-based materials epitaxially grown on a non-GaN-based substrate, which may have some of the above-identified defects present in a layer of the GaN-based material or at an interface of different GaN-based layers.

It should be understood that schematic cross-sectional views shown in FIGS. 3-8 are simply provided for illustrative purposes, and are not intended to limit the scope of the present disclosure. Therefore, the GaN-based integrated circuit 100 can include any of various other GaN-based and/or non-GaN-based components, while remaining within the scope of present disclosure.

Figure 3:
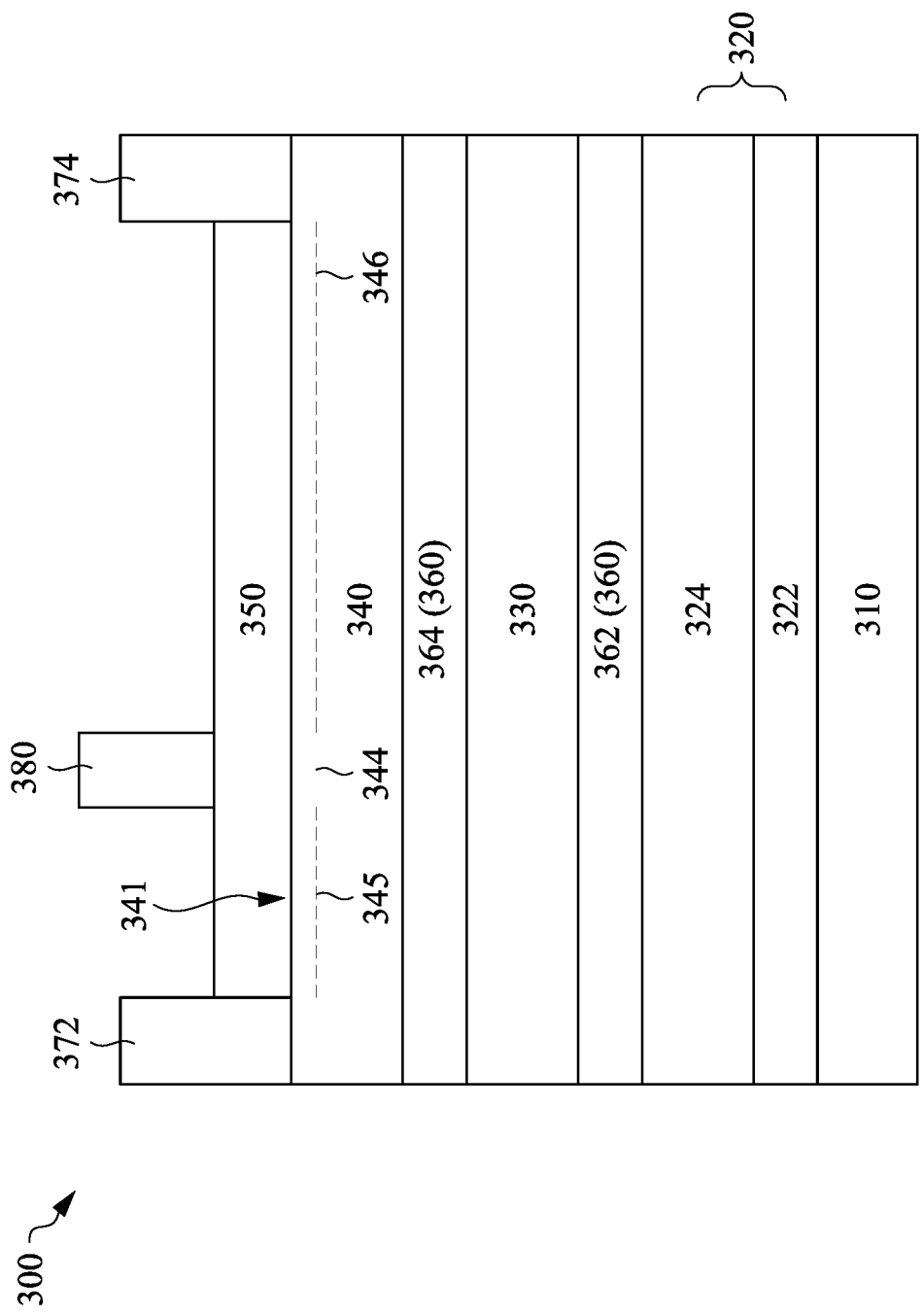
FIGS. 3, 4, 5, 6, 7, and 8 illustrate example cross-sectional views of various GaN-based components of the GaN-based integrated circuit of FIG. 1, in accordance with some embodiments.

Referring first to FIG. 3, the component 300 may be implemented as a power transistor that can be used in the high-voltage circuit 110. In some embodiments, the component 300 may be a high electron mobility transistor (HEMT) having a high current density, high breakdown voltage (an ability of the HEMT to withstand a high gate and/or drain voltage without being damaged and/or exhibiting irregular current behaviors), and low ON resistance, which allows the component 300 to sustain operation with a voltage range of about 40 volts to about 650 volts. Accordingly, the component 300 is hereinafter referred to as "power HEMT 300." A two-dimensional electron gas (2DEG), which will be discussed below, is typically used as charge carriers in such a HEMT.

As shown in the cross-sectional view of FIG. 3, the power HEMT 300 includes a substrate 310, a transition structure 320 over the substrate 310, a buffer layer 330 over the transition structure 320, a channel layer 340 over the buffer layer 330, and an active layer 350 over the channel layer 340. The power HEMT 300 optionally includes a barrier structure 360 between the substrate 310 and the channel layer 340. The power HEMT 300 also includes a source electrode 372 and a drain electrode 374 over the channel layer 340, and a gate electrode 380 over the active layer 350. In some embodiments, the source electrode 372 and the drain electrode 374 are formed over the active layer 350.

The substrate 310 includes a silicon carbide (SiC) substrate, sapphire substrate, or a silicon (Si) substrate. In at least one embodiment, the substrate 310 includes a Si(111) wafer to provide an optimal lattice mismatch with an overlying layer, such as a GaN layer described herein.

The transition structure 320 includes a nucleation layer 322 over the substrate 310. The nucleation layer 322 has a lattice structure and/or a thermal expansion coefficient (TEC) suitable for bridging the lattice mismatch and/or the TEC mismatch between the substrate 310 and an overlying layer, such as a GaN layer described herein. In some embodiments, the nucleation layer 322 includes aluminum nitride (AlN). In some embodiments, the nucleation layer 322 has a thickness of 70 to 300 nanometers (nm). In some embodiments, the nucleation layer 322 is omitted.

The transition structure 320 further includes a transition layer 324 over the nucleation layer 322, or over the substrate 310 in one or more embodiments where the nucleation layer 322 is omitted. The transition layer 324 further facilitates gradual changes of lattice structures and TECs between the nucleation layer 322 (or the substrate 310) and an overlying layer, such as a GaN layer described herein. 3In some embodiments, the transition layer 324 includes a graded aluminum-gallium nitride ($Al_xGa_{(1-x)}N$, x is the aluminum content ratio in the aluminum-gallium constituent, $0<x<1$) layer. In some embodiments, the graded aluminum gallium nitride layer includes multiple layers each having a decreased ratio x, from a bottom layer adjacent the substrate 310 to a top layer adjacent the buffer layer 330. In at least one embodiment, the graded aluminum gallium nitride layer has three layers having the x ratio in the range of 0.7-0.9 for the bottom layer, in the range of 0.4-0.6 for a middle layer, and in the range of 0.15-0.3 for the top layer. In some embodiments, instead of having multiple layers with different x ratios, the graded aluminum gallium nitride layer has a continuous gradient of the ratio x. In some embodiments, the transition layer 324 has a thickness of 500 to 1050 nm. In some embodiments, the transition layer 324 is omitted.

The buffer layer 330 defines a high resistivity layer for increasing the breakdown voltage of the power HEMT 300 (e.g., up to about 650 volts). In some embodiments, the buffer layer 330 includes one or more Group III-V compound layers. Examples of Group III-V compound layers include, but are not limited to, GaN, AlGaN, InGaN and InAlGaN. In some embodiments, the buffer layer 330 includes a dopant to achieve a predetermined high resistivity. In at least one embodiment, the dopant is a p-type dopant. In at least one embodiment, the buffer layer 330 includes GaN doped with the p-type dopant. Examples of the p-type dopant include, but are not limited to, C, Fe, Mg and Zn. In at least one embodiment, a concentration of the p-type dopant in the buffer layer 330 is greater than or equal to about $5 \times 10^{18}$ ions/cm$^3$. In at least one embodiment, the buffer layer 330 has a thickness of 500 to 2000 nm.

The channel layer 340 has a lower resistivity than the buffer layer 330, for improving current performance of the power HEMT 300. In some embodiments, the channel layer 340 includes one or more Group III-V compound layers. Examples of Group III-V compound layers include, but are not limited to, GaN, AlGaN, InGaN and InAlGaN. One or more of the Group III-V compound layers is doped in at least one embodiment. In one or more embodiments, the channel layer 340 includes alternatingly arranged p-doped and n-doped Group III-V compound layers. In at least one embodiment, the channel layer 340 includes a p-doped GaN layer. Examples of the p-type dopant in the p-doped GaN layer include, but are not limited to, C, Fe, Mg and Zn. In at least one embodiment, the concentration of the p-type dopant in the channel layer 340 is lower than that of the buffer layer 330. For example, the concentration of the p-type dopant in the channel layer 340 is lower than or equal to $1 \times 10^{17}$ ions/cm$^3$. In at least one embodiment, the channel layer 340 has a thickness of 200 to 500 nm.

The active layer 350 includes one or more Group III-V compound layers which are different from the Group III-V compound layers of the channel layer 340 in composition. In some embodiments, the active layer 350 comprises AlN, $Al_yGa_{(1-y)}N$ (where y is the aluminum content ratio, 0<y<1), or a combination thereof. The active layer 350 is configured to cause a two-dimensional electron gas (2DEG) to be formed in the channel layer 340 along an interface 341 between the channel layer 340 and the active layer 350. A heterojunction is formed between the active layer 350 and the channel layer 340 having two different semiconductor materials. A band gap discontinuity exists between the active layer 350 and the channel layer 340. The electrons from a piezoelectric effect in the active layer 350 drop into the channel layer 340, and thus create a thin layer 343 of highly mobile conducting electrons, i.e., the 2DEG, in the channel layer 340, adjacent the interface 341 with the active layer 350. The electrons in the 2DEG are charge carriers in the channel layer 340. In some embodiments, when a sufficient voltage is applied to the gate electrode 380, it is possible to modulate a current (i.e., a drain current) flowing through the channel layer 340, from the drain electrode 374 to the source electrode 372.

The 2DEG is generated naturally at the interface 341 of different Group III-V compound materials forming the heterojunction between the channel layer 340 and the active layer 350. Due to the naturally occurring 2DEG, the power HEMT 300 is conductive without the application of a voltage to the gate electrode 380, i.e., the semiconductor device 300 is a normally ON device (sometimes referred to as an depletion mode), in some embodiments.

In some embodiments, the power HEMT 300 can be converted to a normally OFF device (sometimes referred to as an enhancement mode). For example, the gate electrode 380 includes a gate structure configured to deplete the 2DEG under the gate structure, i.e., the 2DEG is depleted in an area 344 under the electrode 380, leaving the 2DEG in areas 345, 346, between (i) the gate electrode 380 and (ii) the source electrode 372 and the drain electrode 374, respectively. In at least one embodiment, the gate structure of the electrode 380 includes a p-doped layer over the active layer 350, and an n-doped layer over the p-doped layer. Example materials for the p-doped layer and/or the n-doped layer include, but are not limited to, GaN, AlGaN, InGaN and InAlGaN. Examples of p-type dopants include, but are not limited to, carbon, iron, magnesium, and zinc. Examples of n-type dopants include, but are not limited to, silicon and oxygen. In at least one embodiment, the n-doped layer is omitted.

The optional barrier structure 360 includes at least one of a first barrier layer 362 or a second barrier layer 364. The first barrier layer 362 is formed between the transition structure 320 and the buffer layer 330. The first barrier layer 362 is configured to block diffusion of the material of the substrate 310 to the buffer layer 330. The second barrier layer 364 is formed between the buffer layer 330 and the channel layer 340. The second barrier layer 364 is configured to block diffusion of the p-type dopant from the buffer layer 330 into the channel layer 340.

Figure 4:
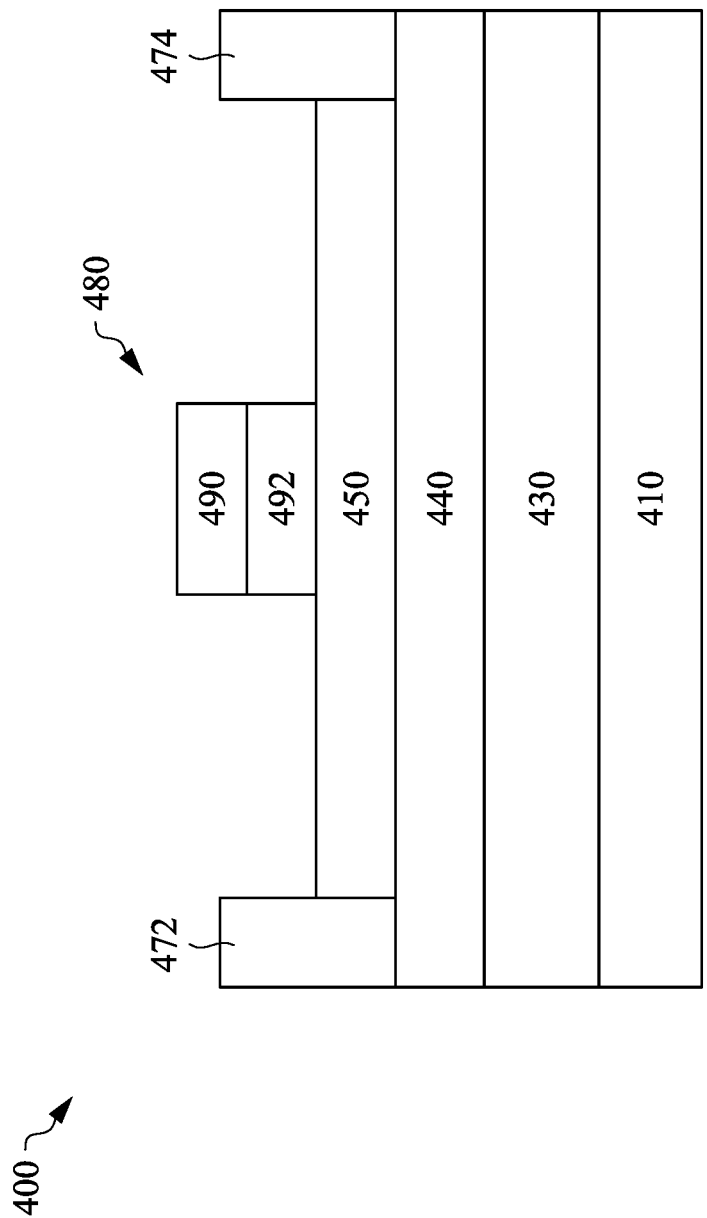

Referring next to FIG. 4, the component 400 may be implemented as a HEMT that can be used in the low-voltage circuit 160. Further, the component 400 may operate under an enhancement mode. Accordingly, the component 400 is hereinafter referred to as "E-HEMT 400." The E-HEMT 400 is substantially similar to the power HEMT 300, but is configured to operate with a relatively low voltage range, e.g., in the range of about 6 volts to about 12 volts (or up to 40 volts). Thus, elements of the E-HEMT 400 will be briefly described as follows.

As shown in the cross-sectional view of FIG. 4, the E-HEMT 400 includes a substrate 410, a buffer layer 430 over the substrate 410, a channel layer 440 over the buffer layer 430, and an active layer 450 over the channel layer 440. The E-HEMT 400 also includes a source electrode 472 and a drain electrode 474 over the channel layer 440, and a gate electrode 480 over the active layer 450. In some embodiments, the source electrode 472 and the drain electrode 474 are formed over the active layer 450. The elements 410, 430, 440, 450, 472, 474, and 480 are substantially similar to the elements 310, 330, 340, 350, 372, 374, and 380 of FIG. 3, respectively, except that the gate electrode 480 further includes a p-doped layer or n-doped layer (e.g., GaN) 492 between the active layer 450 and a metal contact 490.

Figure 5:
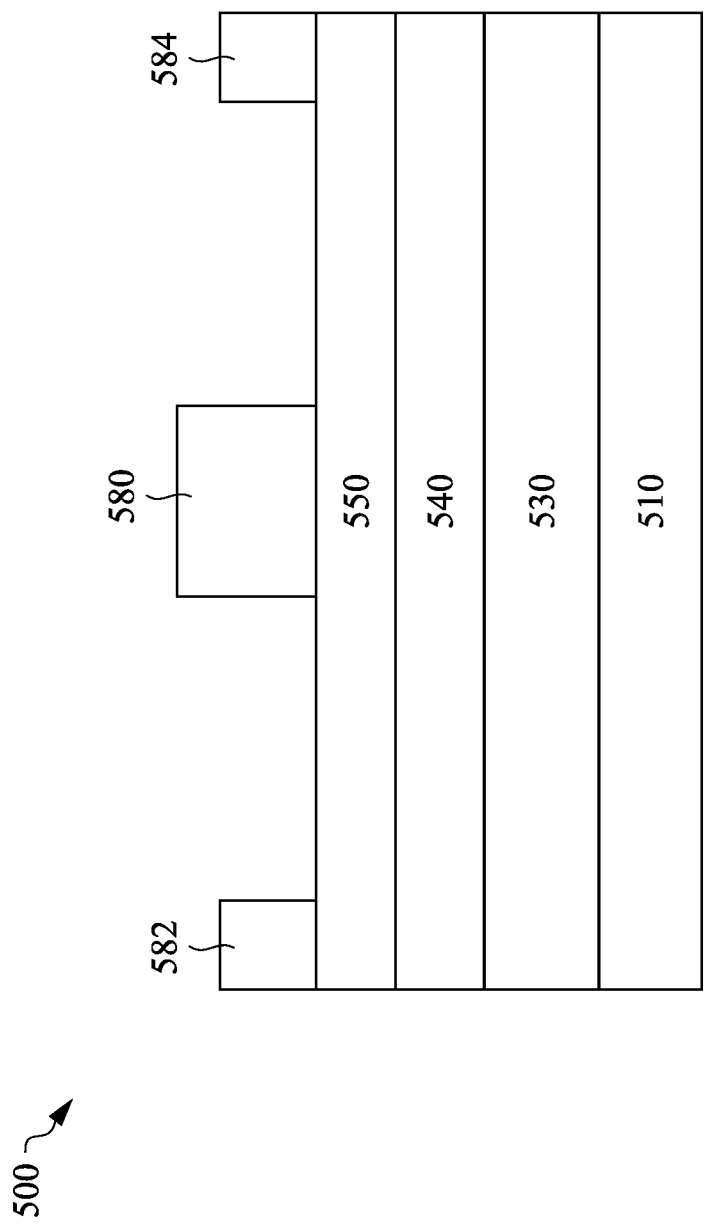

Referring next to FIG. 5, the component 500 may be implemented as a HEMT that can be used in the low-voltage circuit 160. Further, the component 500 may operate under a depletion mode. Accordingly, the component 500 is hereinafter referred to as "D-HEMT 500." The D-HEMT 500 is substantially similar to the power HEMT 300, but is configured to operate with a relatively low voltage range, e.g., in the range of about 6 volts to about 12 volts (or up to 40 volts). Thus, elements of the D-HEMT 500 will be briefly described as follows.

As shown in the cross-sectional view of FIG. 5, the D-HEMT 500 includes a substrate 510, a buffer layer 530 over the substrate 510, a channel layer 540 over the buffer layer 530, and an active layer 550 over the channel layer 540. The D-HEMT 500 also includes a source electrode 572 and a drain electrode 574 over the channel layer 540, and a gate electrode 580 over the active layer 550. In some embodiments, the source electrode 572 and the drain electrode 574 are formed over the active layer 550. The elements 510, 530, 540, 550, 572, 574, and 580 are substantially similar to the elements 310, 330, 340, 350, 372, 374, and 380 of FIG. 3, respectively.

Figure 6:
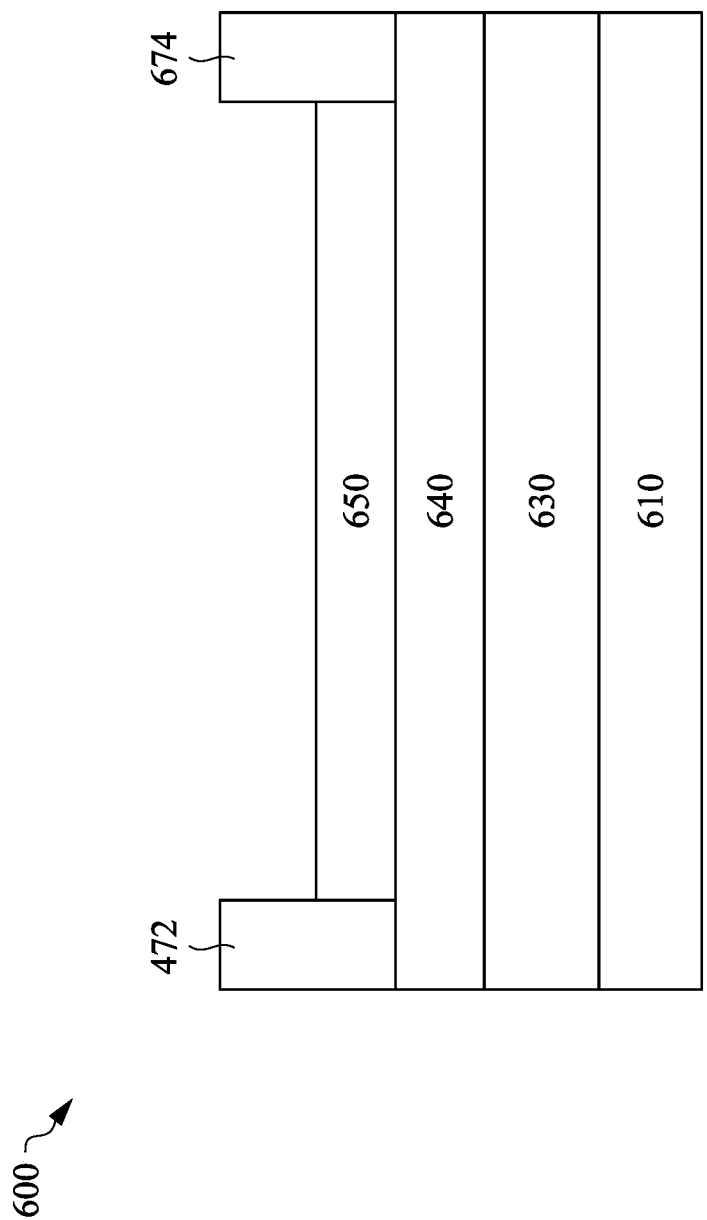

Referring next to FIG. 6, the component 600 may be implemented in a HEMT structure that can be used in the high-voltage circuit 110 and/or the low-voltage circuit 160. The component 600 is substantially similar to the power HEMT 300, but is configured to operate as a two-terminal device, e.g., a resistor. Thus, the component 600 is hereinafter referred to as "HEMT resistor 600," and elements of the HEMT resistor 600 will be briefly described as follows.

As shown in the cross-sectional view of FIG. 6, the HEMT resistor 600 includes a substrate 610, a buffer layer 630 over the substrate 610, a channel layer 640 over the buffer layer 630, and an active layer 650 over the channel layer 640. The HEMT resistor 600 also includes a first electrode 672 and a second electrode 674 over the channel layer 640, which can serve as the two terminals of the HEMT resistor 600, respectively. In some embodiments, the first electrode 672 and the second electrode 674 are formed over the active layer 650. The elements 610, 630, 640, 650, 672, and 674 are substantially similar to the elements 310, 330, 340, 350, 372, and 374 of FIG. 3, respectively.

Other than such a GaN-based resistor (e.g., 600), the GaN-based integrated circuit 100 can also include a number of other type of resistors that are not formed of the GaN-based material. For example, the GaN-based integrated circuit 100 can include a thin film resistor formed of silicon chromium (SiCr). In general, such a thin film resistor has a SiCr thin film formed in a dielectric layer disposed above those HEMT structures. Two ends of the SiCr thin film are connected with two contacts/electrodes that serve as two terminals of the thin film resistor, respectively.

Figure 7:
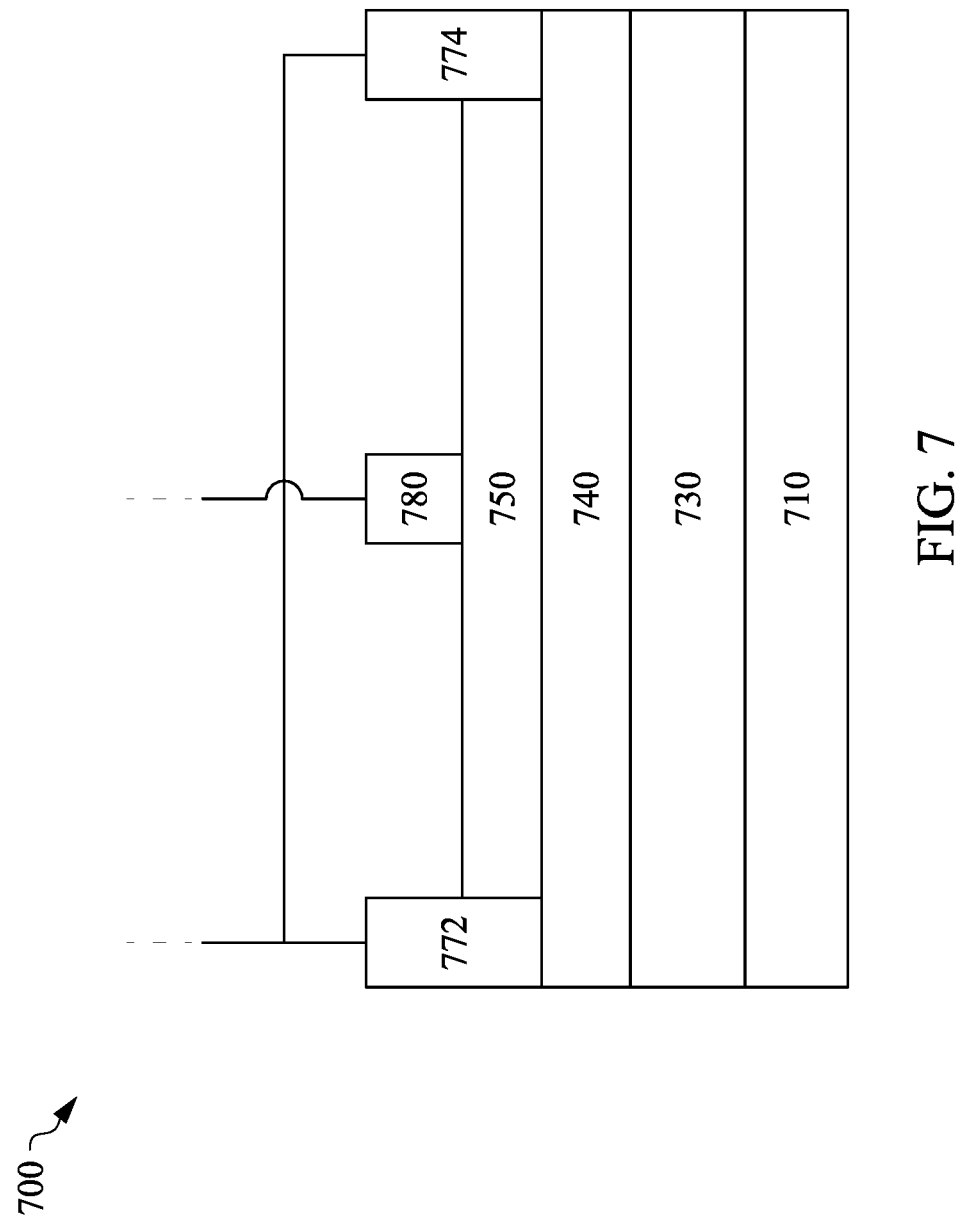

Referring next to FIG. 7, the component 700 may be implemented in a HEMT structure that can be used in the high-voltage circuit 110 and/or the low-voltage circuit 160. The component 700 is substantially similar to the power HEMT 300, but is configured to operate as a two-terminal device, e.g., a capacitor. Thus, the component 700 is hereinafter referred to as "HEMT capacitor 700," and elements of the HEMT capacitor 700 will be briefly described as follows.

As shown in the cross-sectional view of FIG. 7, the HEMT capacitor 700 includes a substrate 710, a buffer layer 730 over the substrate 710, a channel layer 740 over the buffer layer 730, and an active layer 750 over the channel layer 740. The HEMT capacitor 700 also includes a source electrode 772 and a drain electrode 774 over the channel layer 740, and a gate electrode 780 over the active layer 750. In some embodiments, the source electrode 772 and the drain electrode 774 are formed over the active layer 750. The source electrode 772 and drain electrode 774 may be shorted together, with the source electrode 772 and drain electrode 774 serving as a first terminal of the HEMT capacitor 700 and the gate electrode 780 serving as a second terminal of the HEMT capacitor 700. The elements 710, 730, 740, 750, 772, 774, and 780 are substantially similar to the elements 310, 330, 340, 350, 372, 374, and 380 of FIG. 3, respectively.

Other than such a GaN-based capacitor (e.g., 700), the GaN-based integrated circuit 100 can also include a number of other type of capacitors that are not formed of the GaN-based material. For example, the GaN-based integrated circuit 100 can include a metal-insulator-metal (MIM) capacitor disposed above those HEMT structures. In general, the MIM capacitor includes a first interconnect (e.g., metal) structure and a second interconnect (e.g., metal) structure interposing a dielectric layer therebetween. The first interconnect structure and second interconnect structure can serve as two terminals of the MIM capacitor, respectively.

Figure 8:
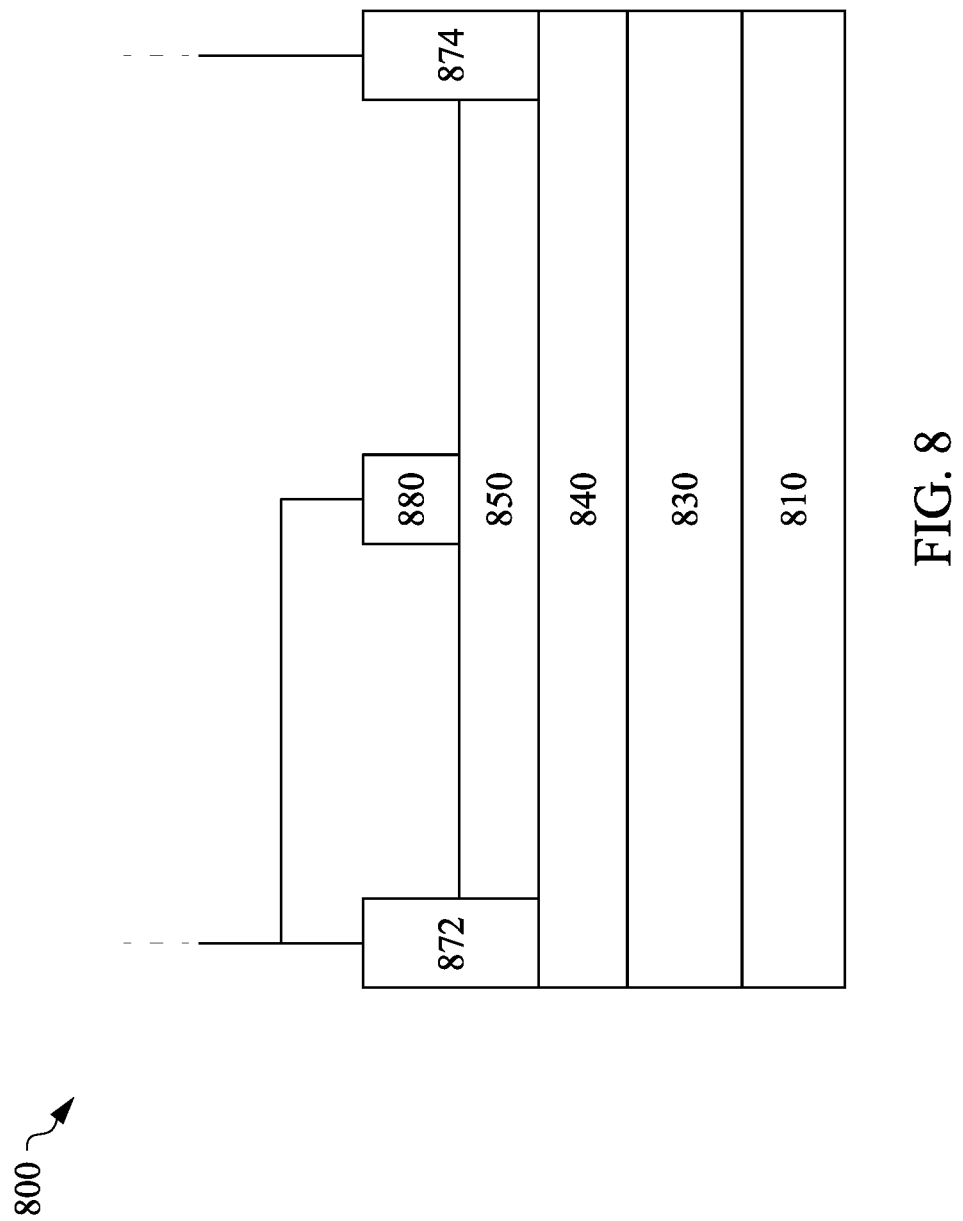

Referring next to FIG. 8, the component 800 may be implemented in a HEMT structure that can be used in the high-voltage circuit 110 and/or the low-voltage circuit 160. The component 800 is substantially similar to the power HEMT 300, but is configured to operate as a two-terminal device, e.g., a diode. Thus, the component 800 is hereinafter referred to as "HEMT diode 800," and elements of the HEMT diode 800 will be briefly described as follows.

As shown in the cross-sectional view of FIG. 8, the HEMT diode 800 includes a substrate 810, a buffer layer 830 over the substrate 810, a channel layer 840 over the buffer layer 830, and an active layer 850 over the channel layer 840. The HEMT diode 800 also includes a source electrode 872 and a drain electrode 874 over the channel layer 840, and a gate electrode 880 over the active layer 850. In some embodiments, the source electrode 872 and the drain electrode 874 are formed over the active layer 850. The source electrode 872 and gate electrode 880 may be shorted together, with the source electrode 872 and gate electrode 880 collectively serving as a first terminal (e.g., anode) of the HEMT diode 800 and the drain electrode 874 serving as a second terminal (e.g., cathode) of the HEMT diode 800. The elements 810, 830, 840, 850, 872, 874, and 880 are substantially similar to the elements 310, 330, 340, 350, 372, 374, and 380 of FIG. 3, respectively.

Figure 9:
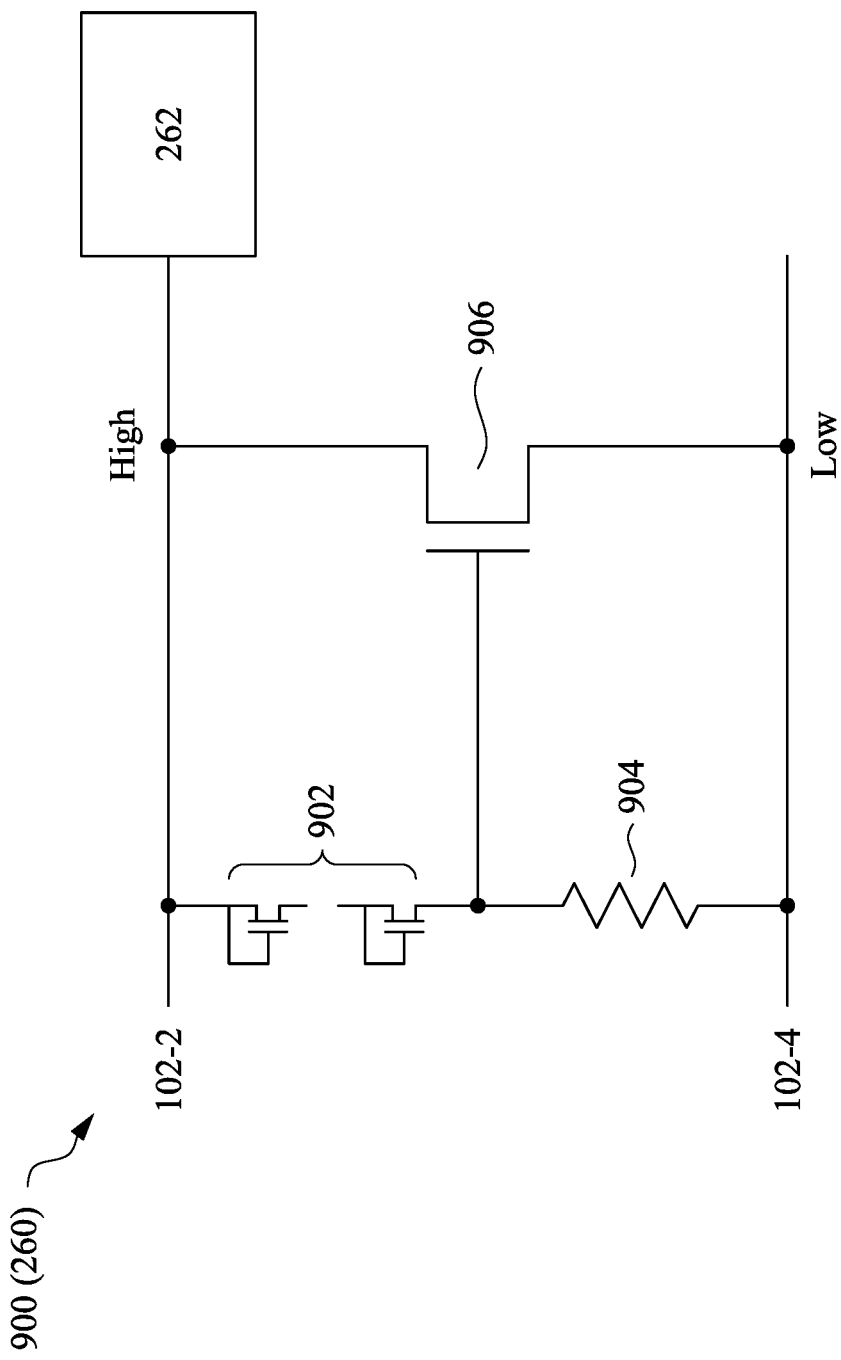
FIGS. 9, 10, and 11 illustrate example circuit diagrams of various GaN-based circuits of the GaN-based integrated circuit of FIG. 1, in accordance with some embodiments.
Figure 10:
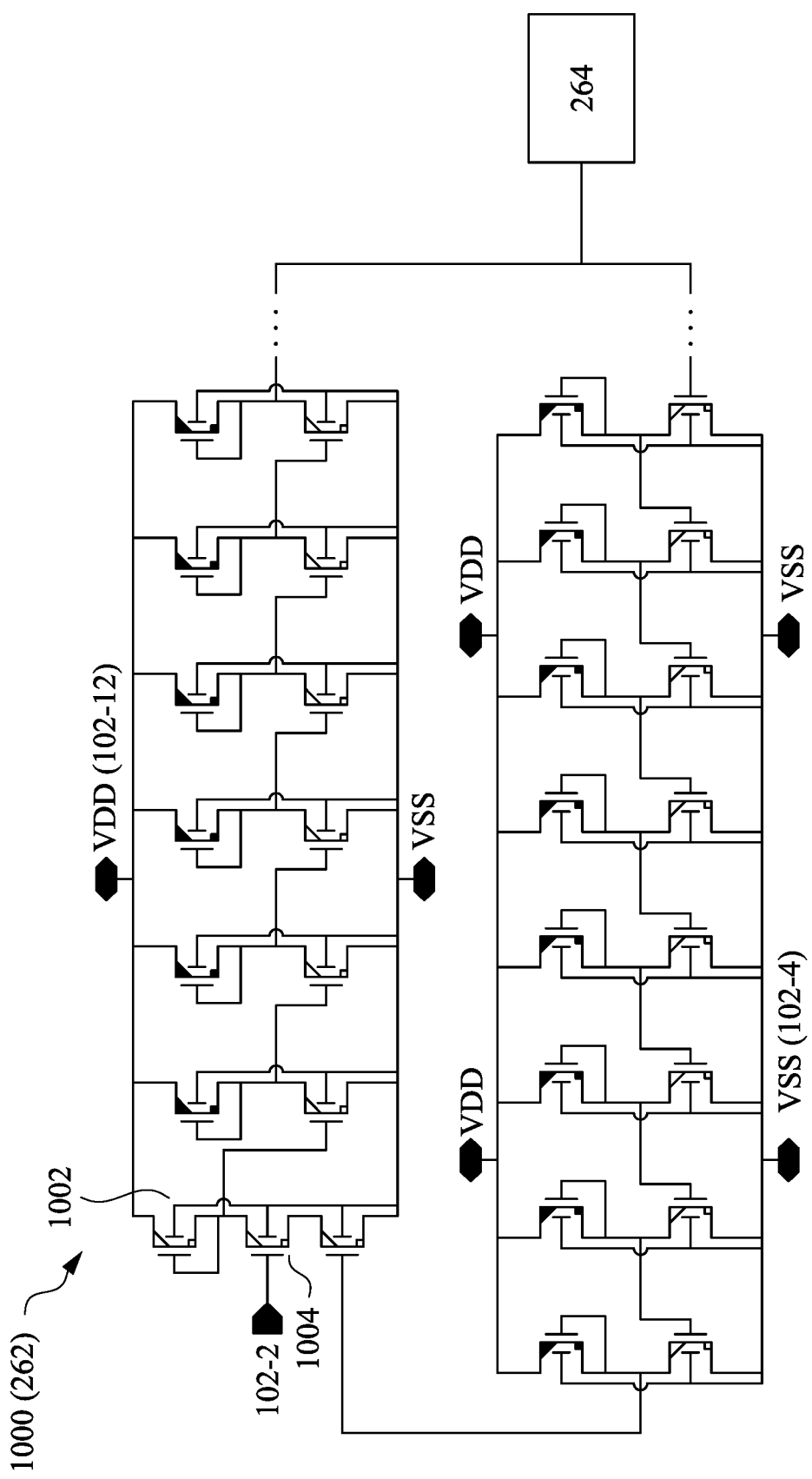
Figure 11:
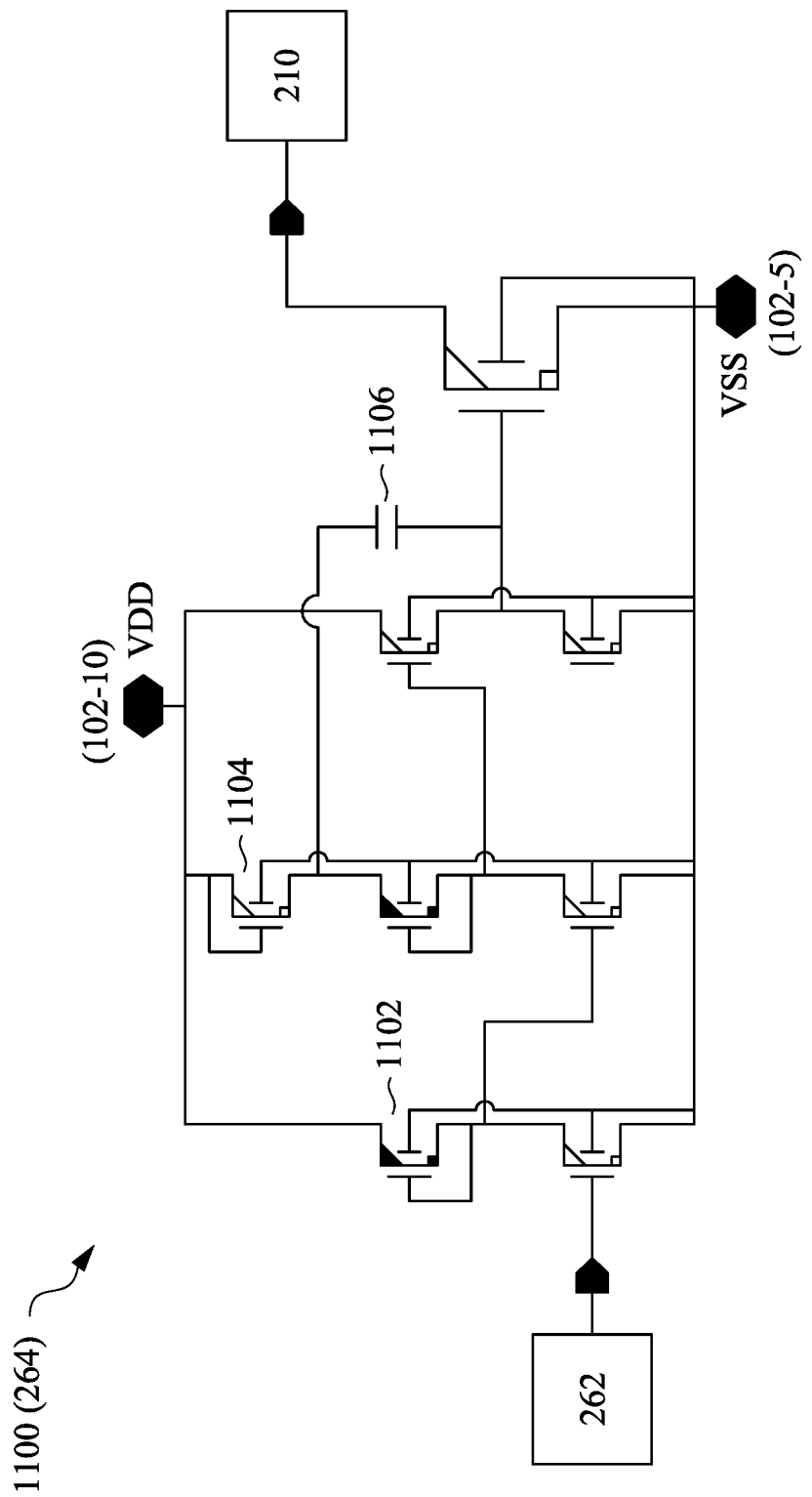

FIGS. 9, 10, and 11 illustrate example circuit diagrams 900, 1000, and 1100 for the ESD protection circuit 260, the control circuit 262, and the driver circuit 264 of the low-voltage circuit 160 of the GaN-based integrated circuit 100, respectively, in accordance with various embodiments. It should be understood that circuit diagrams shown in FIGS. 9-11 are simply provided for illustrative purposes, and are not intended to limit the scope of the present disclosure. Therefore, each of the circuits of the low-voltage circuit 160 can be implemented as any of various other circuit arrangement, while remaining within the scope of present disclosure.

In the example circuit diagram 900 of FIG. 9, the ESD protection circuit 260 can include a number of GaN-based gate-to-source shorted transistors 902 connected in series, a GaN-based or non-GaN-based resistor 904, and a GaN-based shunt transistor 906. In some embodiments, a high side of the ESD protection circuit 260 can be operatively (e.g., electrically) connected between the terminal 102-2 and a circuit in the next stage (e.g., the control circuit 262), and a low side of the ESD protection circuit 260 can be operatively (e.g., electrically) connected to the terminal 102-4.

In the example circuit diagram 1000 of FIG. 10, the control circuit 262 can include a number of GaN-based transistors 1002 and 1004 operatively (e.g., electrically) coupled to one another as shown, and further between a first supply voltage (e.g., VDD) and a second supply voltage (e.g., VSS). The transistors 1002 may have a first conductive type (e.g., p-type) or a first operation mode (e.g., a depletion mode), and the transistors 1004 may have a second conductive type (e.g., n-type) or a second operation mode (e.g., an enhancement mode), which forms the control circuit 262 as a complementary logic circuit. However, it should be appreciated that the control circuit 262 may be constructed as a resistor-transistor logic circuit (where, e.g., p-type transistors are formed of HEMT resistors and n-type transistors are formed of p-GaN gated HEMT), while remaining within the scope of present disclosure. In some embodiments, the first supply voltage and second supply voltage may be received through the terminals 102-12 and 102-4, respectively. In some embodiments, the control circuit 262 can have an input connected to the terminal 102-2 (which may receive a command signal), and an output connected to a circuit in the next stage (e.g., the driver circuit 264). The control circuit 262 can output, for example, a clock signal to the driver circuit 264.

In the example circuit diagram 1100 of FIG. 11, the driver circuit 264 can include a number of GaN-based transistors 1102 and 1104 operatively (e.g., electrically) coupled to one another as shown, and further between a first supply voltage (e.g., VDD) and a second supply voltage (e.g., VSS). The transistors 1102 may have a first conductive type (e.g., p-type) or a first operation mode (e.g., a depletion mode), and the transistors 1104 may have a second conductive type (e.g., n-type) or a second operation mode (e.g., an enhancement mode), which forms the driver circuit 264 as a complementary logic circuit. However, it should be appreciated that the driver circuit 264 may be constructed as a resistor-transistor logic circuit (where, e.g., p-type transistors are formed of HEMT resistors and n-type transistors are formed of p-GaN gated HEMT), while remaining within the scope of present disclosure. In some embodiments, the first supply voltage and second supply voltage may be received through the terminals 102-10 and 102-5, respectively. The driver circuit 264 can further include one or more GaN-based or non-GaN-based capacitors 1106. In some embodiments, the driver circuit 264 can have an input connected to the control circuit 262, and an output connected to a circuit in the next stage (e.g., the power transistor(s) 210). The driver circuit 264 can provide a gate signal to the power transistor(s) 210.

Figure 12:
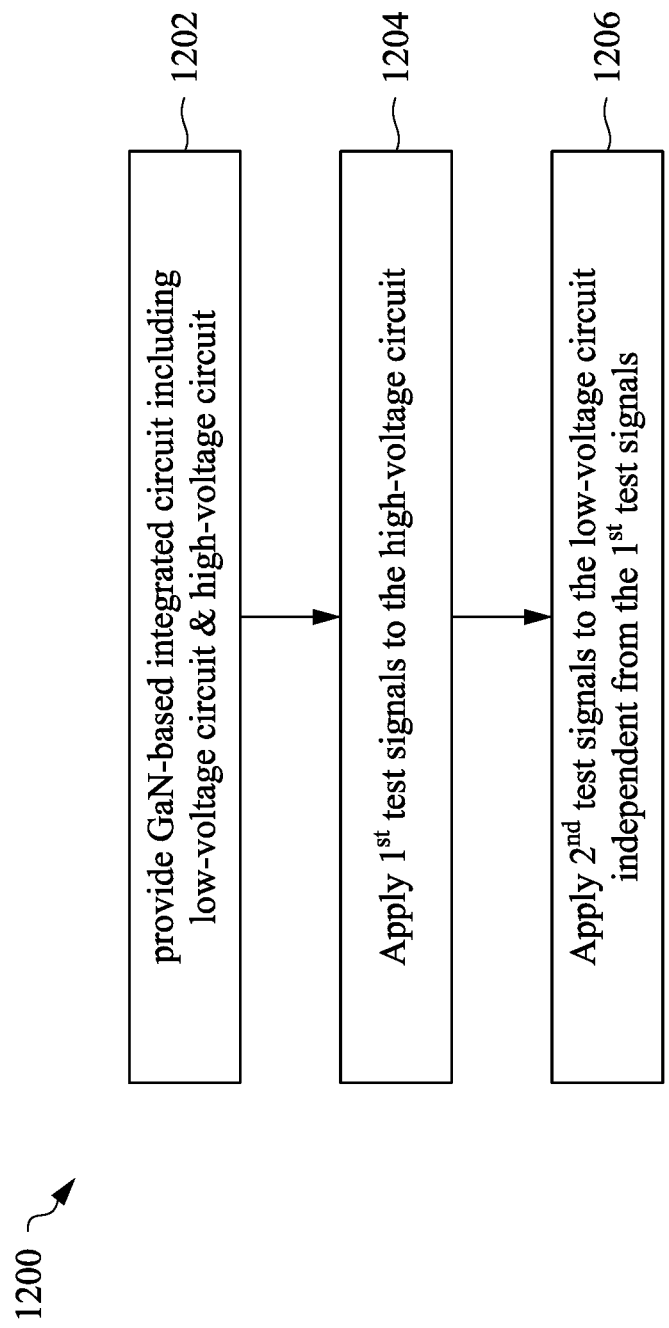
FIG. 12 illustrate a flow chart of example method to test the GaN-based integrated circuit of FIG. 1, in accordance with some embodiments.

Referring now to FIG. 12, depicted is a flow chart of an example method 1200 to identify various defects of the disclosed GaN-based integrated circuit 100, in accordance with various embodiments. The GaN-based integrated circuit 100, as disclosed herein, includes a number of isolated terminals (e.g., 102-1 to 102-12), allowing the operations of the method 1200 to detect, test, screen, or otherwise identify various (e.g., growth) defects of the GaN-based integrated circuit 100 on the circuit level. Accordingly, the following discussion of FIG. 12 will be conducted in conjunction with some of the above figures (e.g., the GaN-based integrated circuit 100 of FIG. 2). The illustrated embodiment of the method 1200 is merely an example. Therefore, it is understood that any of a variety of operations may be omitted, re-sequenced, and/or added while remaining within the scope of the present disclosure.

In brief overview, the method 1200 starts with operation 1202 of providing a GaN-based integrated circuit including at least one high-voltage circuit and at least one low-voltage circuit. The high-voltage circuit and low-voltage circuit are operatively coupled to each other. Further, the high-voltage circuit includes a number of first GaN-based components operating with a first voltage range, and the low-voltage circuit includes a number of second GaN-based components operating with a second voltage range, in which the first voltage range is substantially higher than the first voltage range. Next, the method 1200 proceeds to operation 1204 of applying, through a number of first test terminals of the integrated circuit coupled to the high-voltage circuit, a number of first test signals to the high-voltage circuit.

Concurrently or individually with operation 1204, the method 1200 proceeds to operation 1206 of applying, through a number of second test terminals of the integrated circuit coupled to the low-voltage circuit, a number of test signals to the low-voltage circuit. In various embodiments, the first test signals are independently configured from the second test signals.

Figure 13:
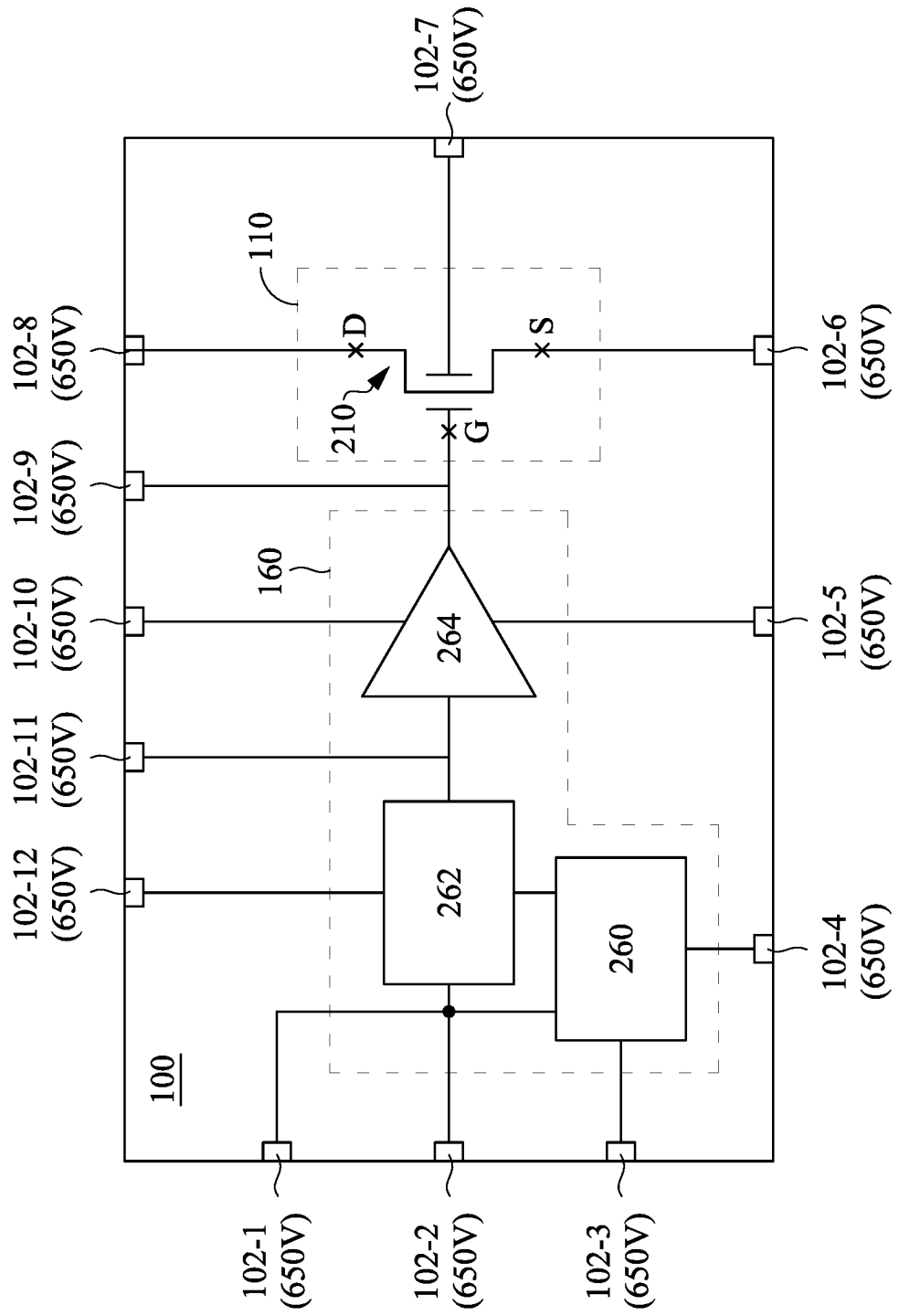
FIGS. 13, 14, 15, 16, 17, and 18 illustrate various test signals implemented by the method of FIG. 12, in accordance with some embodiments.

FIG. 13 illustrates a set of the first test signals and a set of the second test signals being applied to the high-voltage circuit 110 and low-voltage circuit 160, respectively, to identify an epitaxial defect, in accordance with various embodiments. Such an epitaxial defect can exist in any of the GaN-based components of the high-voltage circuit 110 an low-voltage circuit 160. For example, this epitaxial defect may be a global defect in one or more of the GaN-based layers (e.g., due to threading dislocations, grain boundaries, strain, etc.) across the while substrate. Using the component 300 (an implementation of the power transistor 210) of FIG. 3 as a representative example, such an epitaxial defect can be present in any of the layers 322 to 350, or their respective interfaces with adjacent layers.

As shown, the first test signals applied, through the terminals 102-6 to 102-9, to the high-voltage circuit 110, and the second test signals applied, through the terminals 102-1 to 102-5 and 102-10 to 102-12, to the low-voltage circuit 160 are all configured at a relatively high voltage level (e.g., within the operation voltage range of the high-voltage circuit 110), except that the terminal 102-7, connected to the substrate, is tied to a ground voltage. With all the terminals, except for the substrate terminal 102-7, tied to such a high stress voltage, any epitaxial defect can be identified, in response to detecting a sudden voltage drop at any of these terminals. This is because this kind of global epitaxial defect can commonly induce additional leakage in the GaN-based components (e.g., HEMTs). Further, with the terminal 102-6 operatively isolated from the terminals 102-4 or 102-5 and with the terminal 102-9 specifically connected to the gate of the power transistor 210, damage to the gates of other circuits (due to coupling) can be advantageously prevented.

Figure 14:
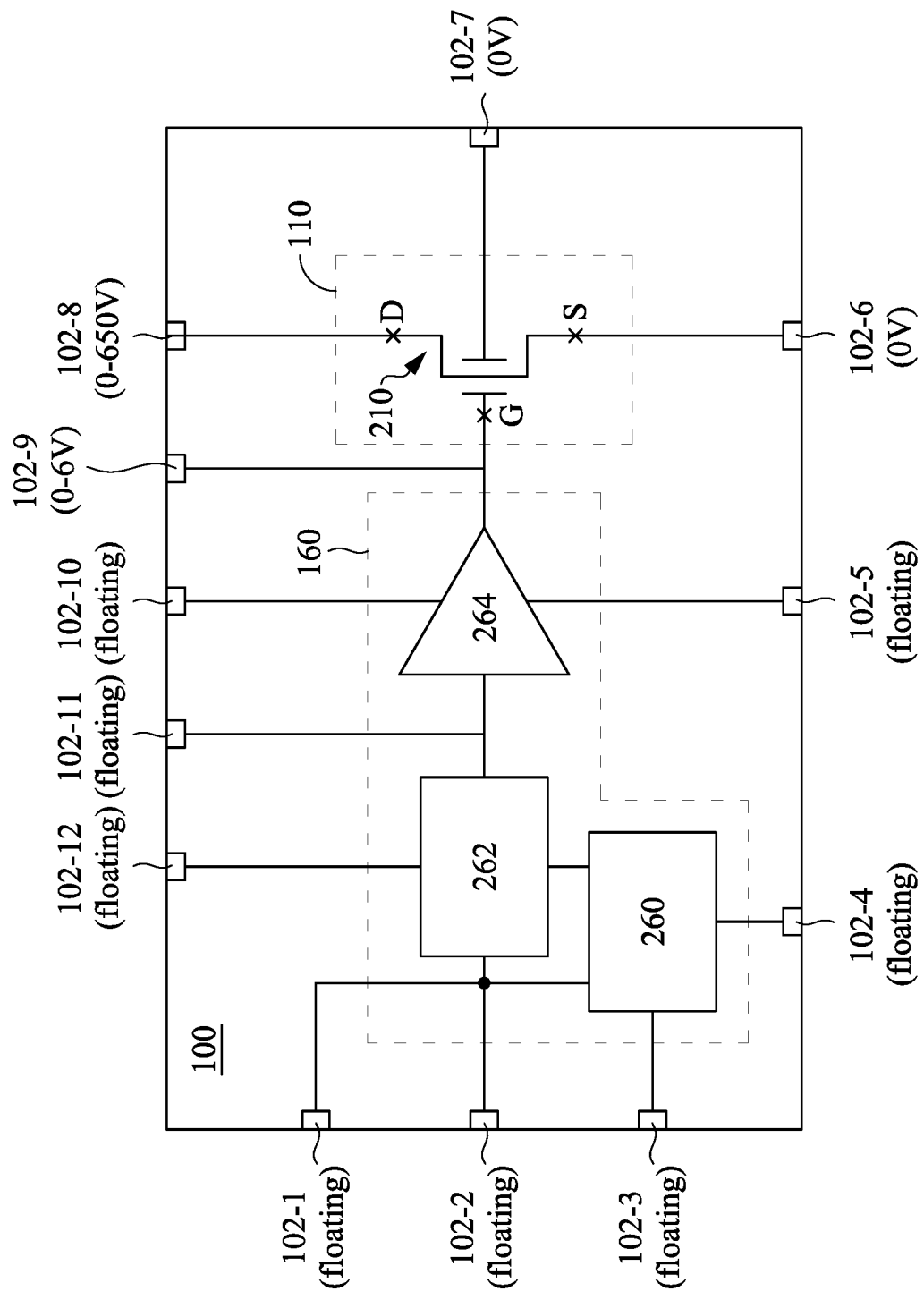

FIG. 14 illustrates another set of the first test signals and another set of the second test signals being applied to the high-voltage circuit 110 and low-voltage circuit 160, respectively, to identify a surface crystal defect, in accordance with various embodiments. Such a surface crystal defect can exist in any of the GaN-based components of the high-voltage circuit 110. For example, this surface crystal defect may be a local defect along a top surface of one or more of the GaN-based layers (e.g., due to contamination, irregular growth, etc.) of the power transistor 210. Using the component 300 (an implementation of the power transistor 210) of FIG. 3 as a representative example, such a surface crystal defect can be present along a top surface of any of the layers 322 to 350.

As shown, the first test signals applied, through the terminals 102-6, 102-8, and 102-9, to the high-voltage circuit 110, are a ground voltage, a first voltage sweep (e.g., from 0 volts to 650 volts), and a second voltage sweep (e.g., from 0 volts to 6 volts), respectively; and the second test signals applied, through the terminals 102-1 to 102-5 and 102-10 to 102-12, to the low-voltage circuit 160 are all configured as a floating voltage, with the terminal 102-7, connected to the substrate, being tied to a ground voltage. In an example where the power transistor 210 is formed in n-type, the signal applied to the terminal 102-9 may be swept from 6 volts to 0 volts (from turning on to turning off the power transistor 210), with the signal applied to the terminal 102-8 also swept from 0 volts to 650 volts. Specifically, when turning on the power transistor 210, its ON resistance is expected to be small. However, when a surface crystal exists, such a small ON resistance may become irregularly large. On the other hand, when turning off the power transistor 210, the voltage level that its drain can sustain is expected to be large. However, when a surface crystal exists, which can interfere a distribution of the electrical field along the GaN-based layer(s), the withstanding voltage at the drain of the power transistor 210 may become irregularly small. Further, with the terminals connected to the low-voltage circuit 110 (102-1 to 102-5 and 102-10 to 102-12) operatively isolated from the terminals connected to the high-voltage circuit 160 (102-6 to 102-9) and being floating, damage to the low-voltage circuit 110 can be advantageously prevented.

Figure 15:
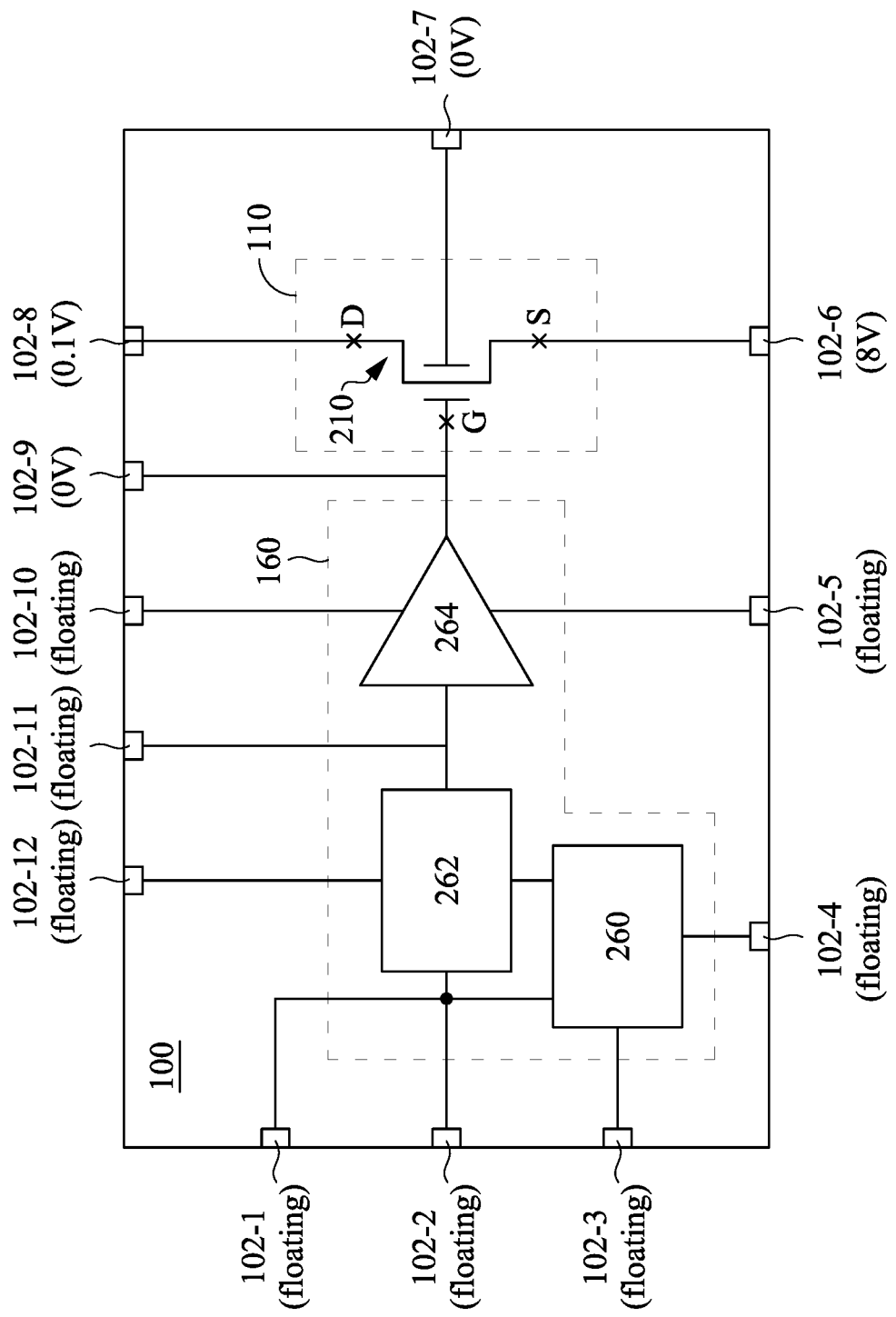

FIG. 15 illustrates yet another set of the first test signals and yet another set of the second test signals being applied to the high-voltage circuit 110 and low-voltage circuit 160, respectively, to identify a defect presented in gates of the HEMTs of the integrated circuit 100, in accordance with various embodiments. Such a gate defect may be a local defect around the gate (e.g., due to contamination, irregular growth, etc.) of the power transistor 210. Using the component 300 (an implementation of the power transistor 210) of FIG. 3 as a representative example, such a gate defect can be present at the interface of the gate electrode 380 and the active layer 350, or in the active layer 350.

As shown, the first test signals applied, through the terminals 102-6, 102-8, and 102-9, to the high-voltage circuit 110, are a first voltage substantially higher than 0 volts (e.g., about 8 volts), a second voltage nearly close to 0 volts (e.g., about 0.1 volts), and a ground voltage, respectively; and the second test signals applied, through the terminals 102-1 to 102-5 and 102-10 to 102-12, to the low-voltage circuit 160 are all configured as a floating voltage, with the terminal 102-7, connected to the substrate, being tied to a ground voltage. In an example where the power transistor 210 is formed in n-type, the signal applied to the terminal 102-6 (source) is substantially higher than the signal applied to the terminal 102-9 (gate), which can still identify whether there is a leakage between the source and gate (e.g., due to a gate defect) while preventing the low-voltage circuit 160 from being damaged. More specifically, with the terminals connected to the low-voltage circuit 110 (102-1 to 102-5 and 102-10 to 102-12) operatively isolated from the terminal connected to the gate of the power transistor 210 (102-9) and being floating, leakage current, if present, can only conduct from the terminal 102-6 to terminal 102-9. Alternatively stated, such leakage current is kept away from the low-voltage circuit 160.

Figure 16:
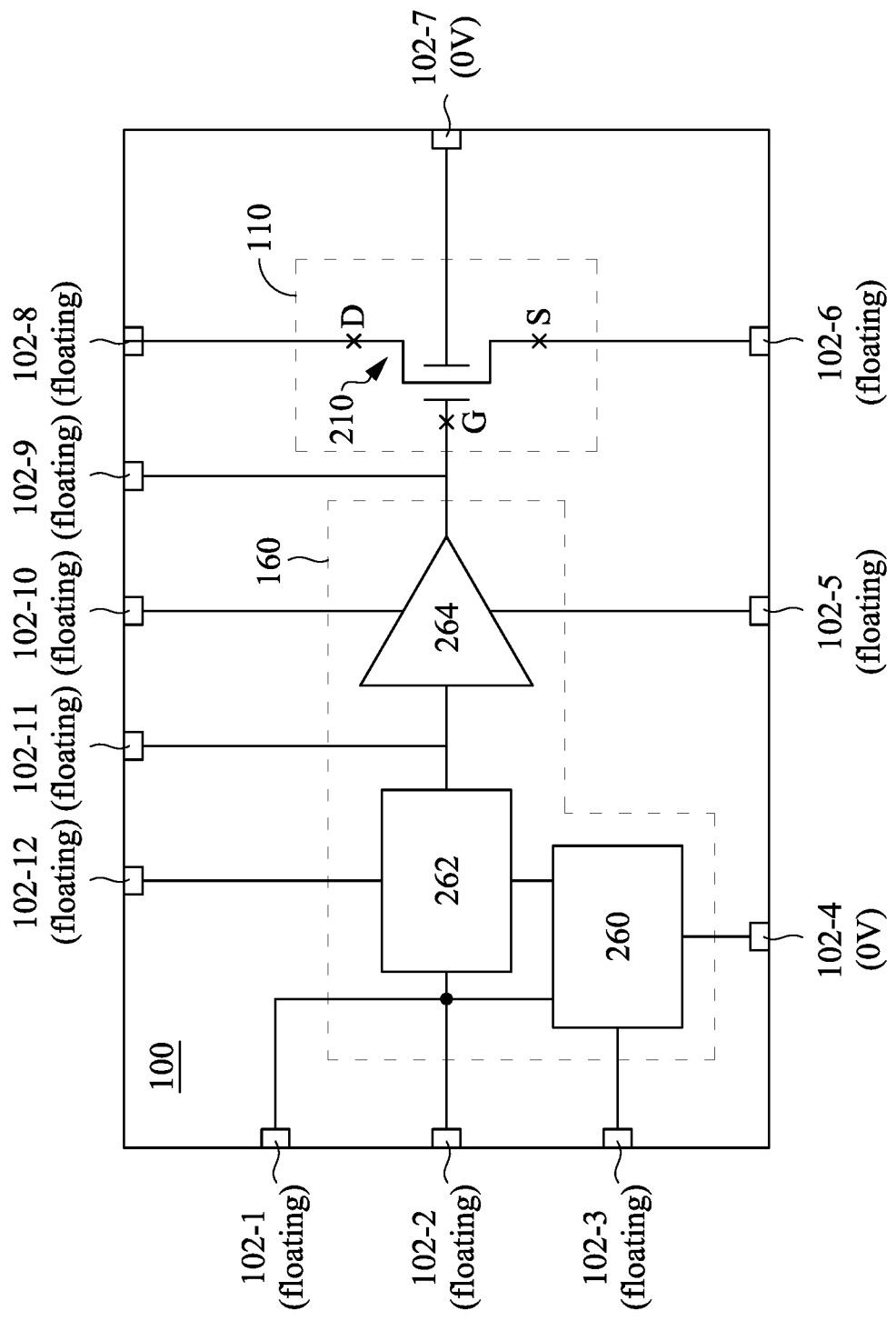

FIG. 16 illustrates yet another set of the first test signals and yet another set of the second test signals being applied to the high-voltage circuit 110 and low-voltage circuit 160, respectively, to identify a malfunction of the ESD protection circuit 260 of the low-voltage circuit 160 of the integrated circuit 100, in accordance with various embodiments.

As shown, the first test signals applied, through the terminals 102-6, 102-8, and 102-9, to the high-voltage circuit 110, are all configured as a floating voltage; and the second test signals applied, through the terminals 102-3 and 102-4, to the ESD protection circuit 260 are a functional signal (e.g., a functional voltage) and a ground voltage, respectively, and the second test signals applied, through the terminals 102-1 to 102-2, 102-5, and 102-10 to 102-12, to other circuits of the low-voltage circuit 160 are all configured as a floating voltage, with the terminal 102-7, connected to the substrate, being tied to a ground voltage. In some embodiments, the functional signal (received through the terminal 102-3) may include any of various signals that correspond to a functionality of the ESD protection circuit 260. For example, the functional signal may serve as an excitation signal to the ESD protection circuit 260, so when the ESD protection circuit 260 receives such an excitation signal, the ESD protection circuit 260 can provide a corresponding response, for example, at its output or at an internal node. By examining the response signals, whether the ESD protection circuit 260, by itself, functions as expected can be determined. Example functional signals may include a pulse voltage, a wave signal, and the like. With the circuits of the low-voltage circuit 160 having their respective test terminals available, each of the circuits of the low-voltage circuit 160 can be individually tested and a root cause of any malfunction of the whole integrated circuit 100 can be efficiently identified.

Figure 17:
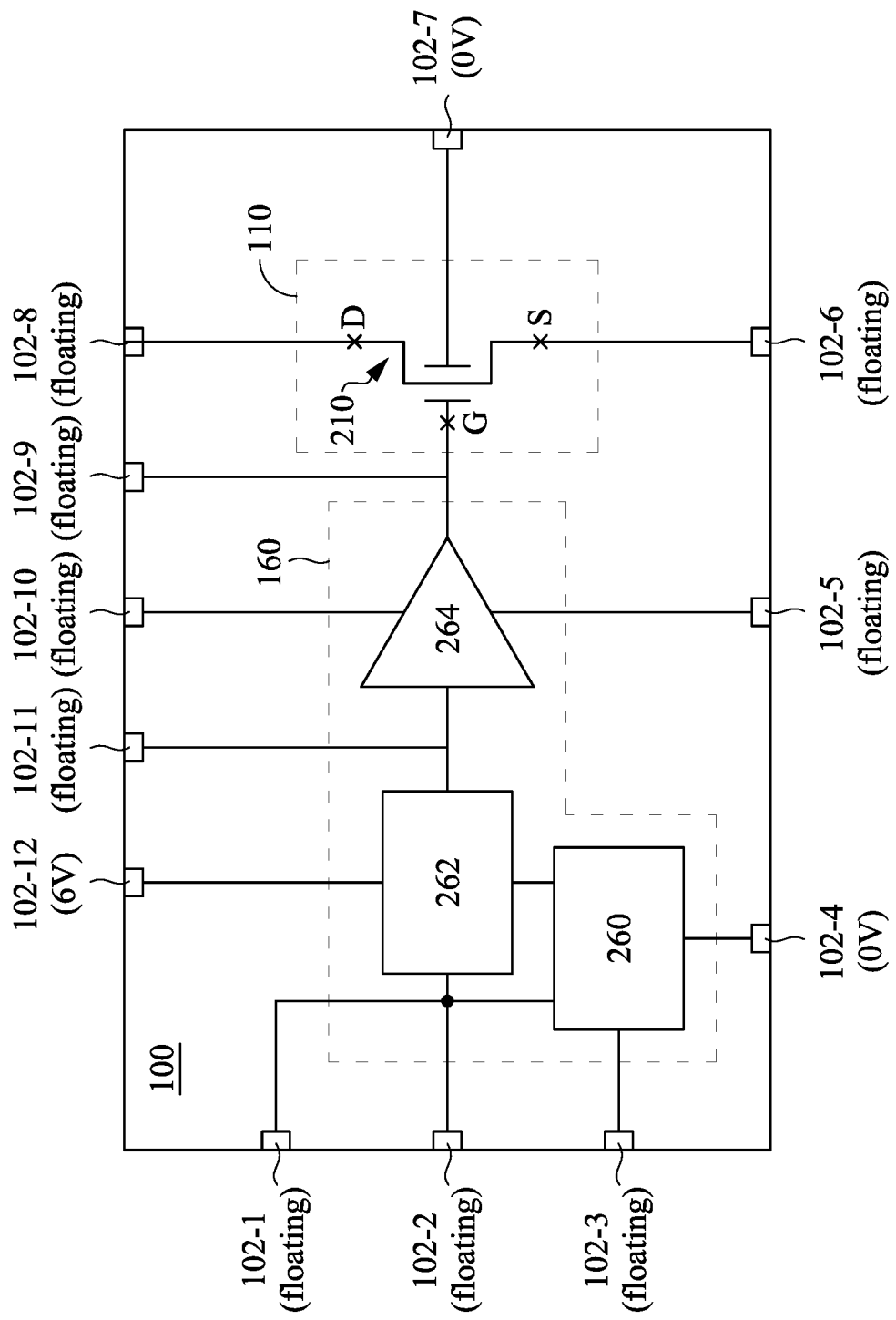

FIG. 17 illustrates yet another set of the first test signals and yet another set of the second test signals being applied to the high-voltage circuit 110 and low-voltage circuit 160, respectively, to identify a malfunction of the control circuit 262 of the low-voltage circuit 160 of the integrated circuit 100, in accordance with various embodiments.

As shown, the first test signals applied, through the terminals 102-6, 102-8, and 102-9, to the high-voltage circuit 110, are all configured as a floating voltage; and the second test signals applied, through the terminals 102-2, 102-4, and 102-12, to the control circuit 262 are a functional signal (e.g., a functional voltage), a ground voltage, and a power supply voltage (e.g., about 6 volts depending on a design of the control circuit 262), respectively, and the second test signals applied, through the terminals 102-1 to 102-3, 102-5, and 102-10 to 102-11, to other circuits of the low-voltage circuit 160 are all configured as a floating voltage, with the terminal 102-7, connected to the substrate, being tied to a ground voltage. In some embodiments, the functional signal (received through the terminal 102-2) may include any of various signals that correspond to a functionality of the control circuit 262. For example, the functional signal may serve as an excitation signal to the control circuit 262, so when the control circuit 262 receives such an excitation signal, the control circuit 262 can provide a corresponding response, for example, at its output or at an internal node. By examining the response signals, whether the control circuit 262, by itself, functions as expected can be determined. Example functional signals may include a pulse voltage, a wave signal, and the like. With the circuits of the low-voltage circuit 160 having their respective test terminals available, each of the circuits of the low-voltage circuit 160 can be individually tested and a root cause of any malfunction of the whole integrated circuit 100 can be efficiently identified.

Figure 18:
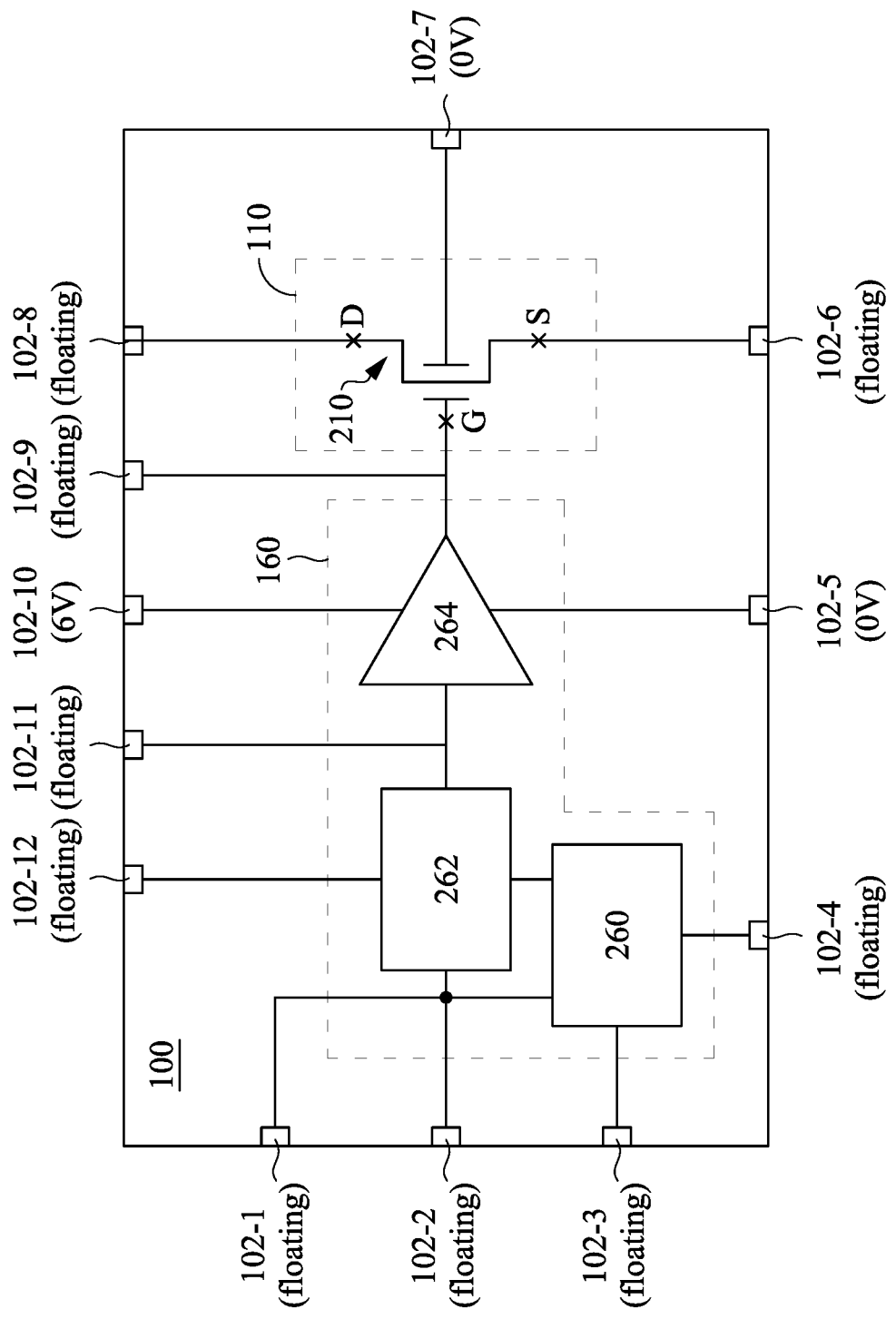

FIG. 18 illustrates yet another set of the first test signals and yet another set of the second test signals being applied to the high-voltage circuit 110 and low-voltage circuit 160, respectively, to identify a malfunction of the driver circuit 264 of the low-voltage circuit 160 of the integrated circuit 100, in accordance with various embodiments.

As shown, the first test signals applied, through the terminals 102-6, 102-8, and 102-9, to the high-voltage circuit 110, are all configured as a floating voltage; and the second test signals applied, through the terminals 102-11, 102-5, and 102-10, to the driver circuit 264 are a functional signal (e.g., a functional voltage), a ground voltage, and a power supply voltage (e.g., about 6 volts depending on a design of the driver circuit 264), respectively, and the second test signals applied, through the terminals 102-1 to 102-4 and 102-12, to other circuits of the low-voltage circuit 160 are all configured as a floating voltage, with the terminal 102-7, connected to the substrate, being tied to a ground voltage. In some embodiments, the functional signal (received through the terminal 102-11) may include any of various signals that correspond to a functionality of the driver circuit 264. For example, the functional signal may serve as an excitation signal to the driver circuit 264, so when the driver circuit 264 receives such an excitation signal, the driver circuit 264 can provide a corresponding response, for example, at its output or at an internal node. By examining the response signals, whether the control circuit 262, by itself, functions as expected can be determined. Example functional signals may include a pulse voltage, a wave signal, and the like. With the circuits of the low-voltage circuit 160 having their respective test terminals available, each of the circuits of the low-voltage circuit 160 can be individually tested and a root cause of any malfunction of the whole integrated circuit 100 can be efficiently identified.

Figure 19:
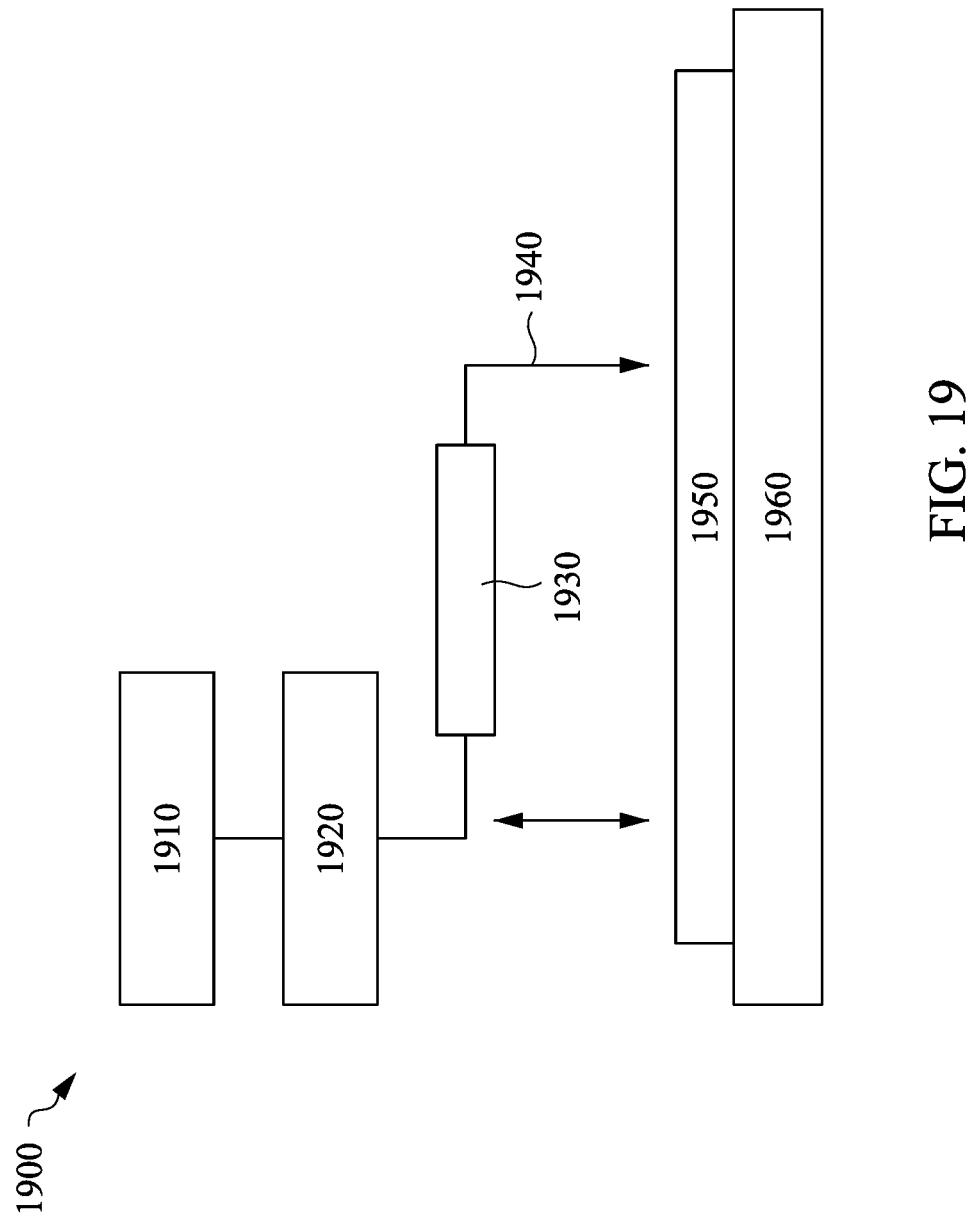
FIG. 19 illustrates a block diagram of a test system to test a GaN-based integrated circuit, in accordance with some embodiments.

FIG. 19 illustrates a simplified block diagram of a test system 1900 that can identify various defects and/or malfunctions of a GaN-based integrated circuit, in accordance with various embodiments. Such a to-be-tested GaN-based integrated circuit can include at least a low-voltage circuitry and a high-voltage circuitry monolithically integrated together. Further, the high-voltage circuitry and low-voltage circuitry of this GaN-based integrated circuit have a respective number of operatively isolated test terminals, which allows the test system 1900 to independently configure test signals for the low-voltage circuitry and high-voltage circuitry.

As shown, the test system 1900 includes at least a controller 1910 and a signal generator 1920 that are operatively coupled to each other. Although being shown as separate blocks, the signal generator 1920 may be integrated into the controller 1910 while remaining within the scope of present disclosure. In various embodiments, the controller 1910 can determine a first set of test signals and a second set of test signals for the low-voltage circuitry and high-voltage circuitry of a to-be-tested GaN-based integrated circuit 1950 placed on a support 1960, respectively. With the high-voltage circuitry and low-voltage circuitry of the GaN-based integrated circuit 1950 having their respective test terminals isolated from each other (e.g., the GaN-based integrated circuit 100), the controller 1910 can independently configure the first set of test signals and the second set of test signals. Upon configuring the first and second sets of test signals, the signal generator 1920 can apply those test signals to the GaN-based integrated circuit 1950 for identifying defects and/or malfunctions of the GaN-based integrated circuit 1950.

The test system 1900 can further include a probe card 1930 that is configured to support a probe 1940. In operation, the probe card 1930 is moved until the probe 1940 makes contact with a certain position of the GaN-based integrated circuit 1950. The movement is indicated by the vertical arrows in FIG. 19. Alignment apparatus such as microscopes or visual display equipment with magnification can be used to move the wafer in the X and Y directions so as to place the probe 1940, for example, on one or more of the test terminals of the GaN-based integrated circuit 1950. After the probe 1940 is placed in electrical contact with the test terminals, the first and second sets of test signals, as discussed above, can be applied to the GaN-based integrated circuit 1950 for identifying its defects and/or malfunctions. Although not shown, the test system 1900 can include a number of (e.g., voltage and/or current) monitors to monitor a response of the GaN-based integrated circuit 1950 after being applied with those test signals. The monitors can be in electrical contact with the GaN-based integrated circuit 1950 through terminals identical to or different from the test terminals through which the test signals are applied.

In one aspect of the present disclosure, an integrated circuit is disclosed. The integrated circuit includes a first circuit, formed based on one or more Group III-V compound materials, that is configured to operate with a first voltage range. The integrated circuit includes a second circuit, also formed based on the one or more Group III-V compound materials, that is operatively coupled to the first circuit and configured to operate with a second voltage range, wherein the second voltage range is substantially higher than the first voltage range. The integrated circuit includes a set of first test terminals connected to the first circuit. The integrated circuit includes a set of second test terminals connected to the second circuit. Test signals applied to the set of first test terminals and to the set of second test terminals, respectively, are independent from each other.

In another aspect of the present disclosure, a method for testing an integrated circuit is disclosed. The method includes providing an integrated circuit including a first circuit and a second circuit operatively coupled to each other. The first circuit includes at least a first transistor operating with a first voltage range and the second circuit includes at least a second transistor operating with a second voltage range. The second voltage range is substantially higher than the first voltage range. The method includes applying, through a plurality of first test terminals of the integrated circuit, a plurality of first test signals to the first transistor. The method includes applying, through a plurality of second test terminals of the integrated circuit, a plurality of second test signals to the second transistor. The plurality of first test signals are independently configured from the plurality of second test signals.

In yet another aspect of the present disclosure, a test system is disclosed. The test system includes a signal generator configured to: apply, through a plurality of first test terminals of an integrated circuit, a plurality of first test signals to a first transistor of the integrated circuit, wherein the first transistor includes gallium nitride and is configured to operate with a first voltage range; and apply, through a plurality of second test terminals of the integrated circuit, a plurality of second test signals to a second transistor of the integrated circuit, wherein the second transistor includes gallium nitride and is configured to operate with a second voltage range that is substantially higher than the first voltage range. The test system includes a controller operatively coupled to the signal generator and configured to determine the plurality of first test signals independently from the plurality of second test signals.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first circuit formed based on one or more Group III-V compound materials and configured to operate with a first voltage range;
   a second circuit formed based on the one or more Group III-V compound materials, operatively coupled to the first circuit, and configured to operate with a second voltage range, wherein the second voltage range is substantially higher than the first voltage range;
   a plurality of first test terminals only operatively coupled to the first circuit; and
   a plurality of second test terminals only operatively coupled to the second circuit.

2. The integrated circuit of claim 1, wherein the one or more Group III-V compound materials include gallium nitride.

3. The integrated circuit of claim 1, wherein the plurality of first test terminals are operatively coupled to a gate, a drain, and a source of at least one of a plurality of first transistors of the first circuit, respectively, and the plurality of second test terminals are operatively coupled to a gate, a drain, and a source of at least one of a plurality of second transistors of the second circuit, respectively.

4. The integrated circuit of claim 1, wherein test signals applied to the plurality of first test terminals and to the plurality of second test terminals, respectively, are independent from each other.

5. The integrated circuit of claim 4, wherein the test signals applied to the set of first test terminals, respectively, include a first signal, a second signal, and a third signal that are each a first fixed voltage in the second voltage range, and the test signals applied to the set of second test terminals, respectively, include a fourth signal, a fifth signal, and a sixth signal that are each a second fixed voltage in the second voltage range.

6. The integrated circuit of claim 5, wherein the test signals applied to the plurality of first test terminals and to the plurality of second test terminals are configured to identify an epitaxial defect for at least one of the first circuit or second circuit.

7. The integrated circuit of claim 4, wherein the test signals applied to the plurality of first test terminals, respectively, include a seventh signal, an eighth signal, and a ninth signal that are each a floating voltage, and the test signals applied to the plurality of second test terminals, respectively, include a tenth signal, an eleventh signal, and a twelfth signal that are a first voltage sweep, a second voltage sweep, and a ground voltage, respectively.

8. The integrated circuit of claim 7, wherein the test signals applied to the plurality of first test terminals and to the plurality of second test terminals are configured to identify a surface crystal defect for the second circuit.

9. The integrated circuit of claim 4, wherein the test signals applied to the plurality of first test terminals, respectively, include a thirteenth signal, an fourteenth signal, and a fifteenth signal that are each a floating voltage, and the test signals applied to the plurality of second test terminals, respectively, include a sixteenth signal, a seventeenth signal, and an eighteenth signal that are a ground voltage, a third fixed voltage, and a fourth fixed voltage, and wherein the fourth fixed voltage is substantially higher than the ground voltage.

10. The integrated circuit of claim 4, wherein the test signals applied to the plurality of first test terminals and to the plurality of second test terminals are configured to test the gate of the at least one of the second transistors of the second circuit.

11. The integrated circuit of claim 4, wherein the test signals applied to the plurality of first test terminals, respectively, include a nineteenth signal, a twentieth signal, a twenty-first signal that are a functional voltage, a fifth fixed voltage, and a ground voltage, and the test signals applied to the plurality of second test terminals, respectively, include a twenty-second signal, twenty-third signal, and twenty-fourth signal that are each a floating voltage.

12. The integrated circuit of claim 11, wherein the test signals applied to the plurality of first test terminals and to the plurality of second test terminals are configured to test a function of the first circuit.

13. An integrated circuit, comprising:
    a first circuit formed based on gallium nitride, wherein the first circuit is configured to operate with a first voltage range;
    a second circuit formed based on the gallium nitride, wherein the second circuit is configured to operate with a second voltage range that is substantially higher than the first voltage range;
    a plurality of first test terminals connected only to the first circuit; and
    a plurality of second test terminals connected only to the second circuit;
    wherein test signals applied to the plurality of first test terminals and to the plurality of second test terminals, respectively, are independent from each other.

14. The integrated circuit of claim 13, wherein the plurality of first test terminals are operatively coupled to a gate, a drain, and a source of at least one of a plurality of first transistors of the first circuit, respectively, and the plurality of second test terminals are operatively coupled to a gate, a drain, and a source of at least one of a plurality of second transistors of the second circuit, respectively.

15. The integrated circuit of claim 14, wherein the test signals applied to the plurality of first test terminals, respectively, include a first signal, a second signal, and a third signal that are each a first fixed voltage in the second voltage range, and the test signals applied to the plurality of second test terminals, respectively, include a fourth signal, a fifth signal, and a sixth signal that are each a second fixed voltage in the second voltage range, and wherein the test signals applied to the plurality of first test terminals and to the plurality of second test terminals are configured to identify an epitaxial defect for at least one of the first circuit or second circuit.

16. The integrated circuit of claim 14, wherein the test signals applied to the plurality of first test terminals, respectively, include a seventh signal, an eighth signal, and a ninth signal that are each a floating voltage, and the test signals applied to the plurality of second test terminals, respectively, include a tenth signal, an eleventh signal, and a twelfth signal that are a first voltage sweep, a second voltage sweep, and a ground voltage, respectively, and wherein the test signals applied to the plurality of first test terminals and to the plurality of second test terminals are configured to identify a surface crystal defect for the second circuit.

17. The integrated circuit of claim 14, wherein the test signals applied to the plurality of first test terminals, respectively, include a thirteenth signal, an fourteenth signal, and a fifteenth signal that are each a floating voltage, and the test signals applied to the plurality of second test terminals, respectively, include a sixteenth signal, a seventeenth signal, and an eighteenth signal that are a ground voltage, a third fixed voltage, and a fourth fixed voltage, and wherein the fourth fixed voltage is substantially higher than the ground voltage.

18. The integrated circuit of claim 14, wherein the test signals applied to the plurality of first test terminals, respectively, include a nineteenth signal, a twentieth signal, a twenty-first signal that are a functional voltage, a fifth fixed voltage, and a ground voltage, and the test signals applied to the plurality of second test terminals, respectively, include a twenty-second signal, twenty-third signal, and twenty-fourth signal that are each a floating voltage, and wherein the test signals applied to the plurality of first test terminals and to the plurality of second test terminals are configured to test a function of the first circuit.

19. An integrated circuit, comprising:
a first circuit formed based on one or more Group III-V compound materials and configured to operate with a first voltage range;
a second circuit formed based on the one or more Group III-V compound materials, operatively coupled to the first circuit, and configured to operate with a second voltage range, wherein the second voltage range is substantially higher than the first voltage range;
a plurality of first test terminals only operatively coupled to the first circuit; and
a plurality of second test terminals only operatively coupled to the second circuit;
wherein the plurality of first test terminals are operatively coupled to a gate, a drain, and a source of at least one of a plurality of first transistors of the first circuit, respectively, and the plurality of second test terminals are operatively coupled to a gate, a drain, and a source of at least one of a plurality of second transistors of the second circuit, respectively.

20. The integrated circuit of claim 19, wherein the one or more Group III-V compound materials include gallium nitride.

* * * * *